(12) United States Patent
Chen et al.

(10) Patent No.: US 11,239,193 B2
(45) Date of Patent: Feb. 1, 2022

(54) INTEGRATED CIRCUIT PACKAGE AND METHOD

(71) Applicant: Taiwan Semiconductor Manufacturing Company, Ltd., Hsinchu (TW)

(72) Inventors: Chien-Hsun Chen, Zhutian Township (TW); Shou-Yi Wang, Hsinchu (TW); Jiun Yi Wu, Zhongli (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 189 days.

(21) Appl. No.: 16/745,933

(22) Filed: Jan. 17, 2020

(65) Prior Publication Data
US 2021/0225792 A1 Jul. 22, 2021

(51) Int. Cl.
*H01L 23/00* (2006.01)
*H01L 23/66* (2006.01)
(Continued)

(52) U.S. Cl.
CPC .......... *H01L 24/24* (2013.01); *H01L 21/4853* (2013.01); *H01L 21/4857* (2013.01); *H01L 21/6835* (2013.01); *H01L 23/3128* (2013.01); *H01L 23/49816* (2013.01); *H01L 23/5383* (2013.01); *H01L 23/5386* (2013.01); *H01L 23/66* (2013.01); *H01L 24/19* (2013.01); *H01L 24/81* (2013.01); *H01L 25/18* (2013.01); *H01L 2221/68359* (2013.01); *H01L 2221/68381* (2013.01); *H01L 2223/6627* (2013.01);
(Continued)

(58) Field of Classification Search
CPC ......... H01L 24/24; H01L 24/25; H01L 24/82; H01L 23/5383; H01L 23/5386; H01L 21/4857
See application file for complete search history.

(56) References Cited

U.S. PATENT DOCUMENTS 8,448,100 B1 5/2013 Lin et al.
8,631,372 B2 1/2014 Yu et al.
(Continued)

*Primary Examiner* — Marcos D. Pizarro
*Assistant Examiner* — Antonio B Crite
(74) *Attorney, Agent, or Firm* — Slater Matsil, LLP

(57) ABSTRACT

In an embodiment, a device includes: a semiconductor device; and a redistribution structure including: a first dielectric layer; a first grounding feature on the first dielectric layer; a second grounding feature on the first dielectric layer; a first pair of transmission lines on the first dielectric layer, the first pair of transmission lines being laterally disposed between the first grounding feature and the second grounding feature, the first pair of transmission lines being electrically coupled to the semiconductor device; a second dielectric layer on the first grounding feature, the second grounding feature, and the first pair of transmission lines; and a third grounding feature extending laterally along and through the second dielectric layer, the third grounding feature being physically and electrically coupled to the first grounding feature and the second grounding feature, where the first pair of transmission lines extend continuously along a length of the third grounding feature.

20 Claims, 35 Drawing Sheets

(51) Int. Cl.
  *H01L 23/498*  (2006.01)
  *H01L 23/538*  (2006.01)
  *H01L 23/31*   (2006.01)
  *H01L 21/48*   (2006.01)
  *H01L 21/683*  (2006.01)
  *H01L 25/18*   (2006.01)

(52) U.S. Cl.
  CPC ........ *H01L 2224/24137* (2013.01); *H01L 2224/24225* (2013.01); *H01L 2924/1431* (2013.01); *H01L 2924/1434* (2013.01)

(56) References Cited

U.S. PATENT DOCUMENTS

| | | |
|---|---|---|
| 8,669,780 B2 | 3/2014 | Chi |
| 8,701,073 B1 | 4/2014 | Fu et al. |
| 8,754,818 B2 | 6/2014 | Yen et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2013/0246990 A1 | 9/2013 | Yen et al. |
| 2013/0320553 A1 | 12/2013 | Kuo et al. |
| 2014/0043148 A1 | 2/2014 | Wang et al. |
| 2014/0077057 A1 | 3/2014 | Chao et al. |
| 2014/0092939 A1 | 4/2014 | Chang et al. |
| 2014/0126089 A1 | 5/2014 | Chang et al. |
| 2014/0126274 A1 | 5/2014 | Lee et al. |
| 2014/0167799 A1 | 6/2014 | Wang et al. |
| 2014/0195728 A1 | 7/2014 | Hsu et al. |
| 2014/0203397 A1 | 7/2014 | Yen et al. |
| 2014/0211438 A1 | 7/2014 | Lin et al. |
| 2014/0239427 A1 | 8/2014 | Huang et al. |
| 2014/0264772 A1 | 9/2014 | Horng et al. |
| 2014/0266273 A1 | 9/2014 | Wang et al. |
| 2017/0278830 A1* | 9/2017 | Kim ............... H01L 23/562 |

\* cited by examiner

INTEGRATED CIRCUIT PACKAGE AND METHOD

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
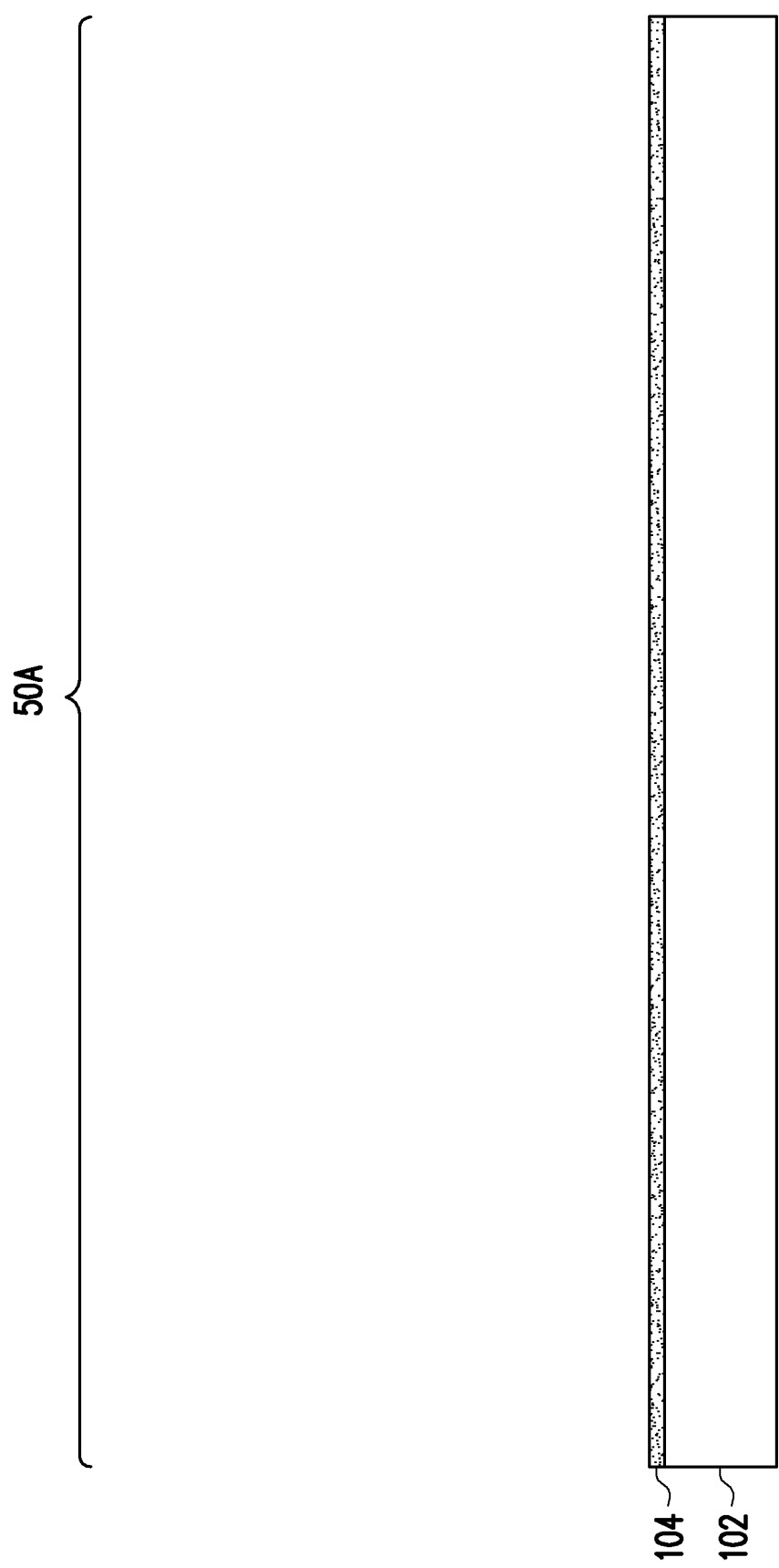
FIGS. 1 through 18 are various views of intermediate steps during a process for forming a package component, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a grounding structure is formed as part of a redistribution structure. The grounding structure extends along transmission lines of the redistribution structure, and helps isolate the transmission lines from other conductive features. The redistribution structure comprises dielectric layers, which can be formed of a photo-sensitive material or a photo-insensitive material, with metallization patterns formed between the dielectric layers. By forming the redistribution structure of dielectric layers, the metallization patterns may be formed by the use of photolithography and plating techniques, which allows the metallization patterns to be formed to a smaller size. The quantity of layers of the redistribution structure may thus be reduced, thereby reducing manufacturing costs.

FIGS. 1 through 19 are various views of intermediate steps during a process for forming a package component 50, in accordance with some embodiments. FIGS. 1 through 15 and 17 through 19 are cross-sectional views. FIGS. 16A and 16B are three-dimensional views. FIG. 20 is a cross-sectional view of the resulting package component 50. The package component 50 includes a redistribution structure 52, an interposer 54, and a semiconductor device 56. The redistribution structure 52 is disposed between the interposer 54 and the semiconductor device 56. The semiconductor device 56 is a three-dimensional integrated circuit (3DIC) device, such as a chip-on-wafer (CoW) device, that incorporates multiple integrated circuit dies in a side-by-side manner. The interposer 54 and semiconductor device 56 are parts of a package substrate, on which the semiconductor device 56 is mounted. The package component 50 is a package implementing the 3DIC device, such as a chip-on-wafer-on-substrate (CoWoS) package The redistribution structure 52 is attached to the interposer 54 with conductive connectors 58, and an underfill 60 may be formed around the conductive connectors 58. The semiconductor device 56 is attached to the redistribution structure 52 with conductive connectors 62, and an underfill 64 may be formed around the conductive connectors 62. The package component 50 may also include external connectors 66, which are used to physically and electrically couple the package component 50 to external devices.

The redistribution structure 52 and interposer 54 collectively redistribute and fan-out connections from the semiconductor device 56 for electrical coupling to external connectors. The redistribution structure 52 has small conductive features for coupling to the semiconductor device 56, and the interposer 54 has large conductive features for coupling to the external connectors 66. The conductive features of the redistribution structure 52 are formed by photolithography and plating techniques, which are suitable for producing small conductive features at a low cost, and the conductive features of the interposer 54 are formed by laser drilling techniques, which are suitable for producing large conductive features at a low cost. By combining the redistribution structure 52 and interposer 54 in a same package component 50, manufacturing costs may be reduced.

A first package region 50A is illustrated in FIGS. 1 through 2, 10 through 14, and 17 through 18, in which the package component 50 is formed. During or after formation, a singulation process is performed by sawing along scribe line regions, e.g., around the first package region 50A. The sawing singulates the first package region 50A from adjacent package regions. The resulting, singulated package component 50 is from the first package region 50A. It should be appreciated that multiple package regions can be formed simultaneously, and a package component 50 can be formed in each of the package regions.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a large degree of planarity.

Figure 2:
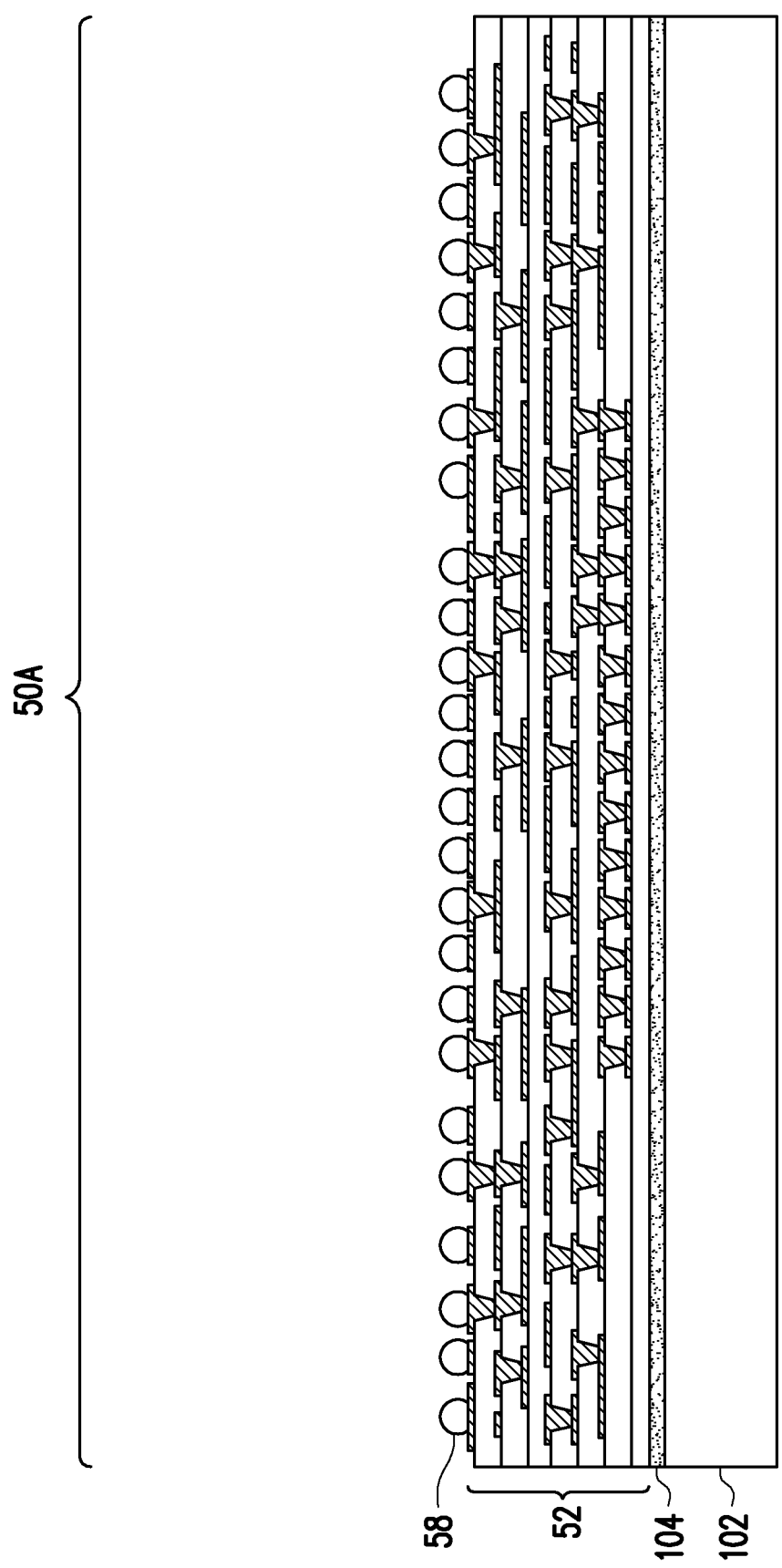

In FIG. 2, the redistribution structure 52 is formed on the release layer 104, and the conductive connectors 58 are formed on to the redistribution structure 52. FIGS. 3 through 9 are various views of intermediate steps during a process for forming the redistribution structure 52, in accordance with some embodiments. A detailed view of a region of the redistribution structure 52 is shown. Some features in FIGS. 3 through 9 are omitted from FIG. 2 for simplicity of illustration.

The completed redistribution structure 52 (see FIG. 9) includes dielectric layers 106, 110, 116, 122, 126, 130, 134; metallization patterns 108, 114, 120, 124, 128, 132; and under-bump metallurgies (UBMs) 136. The metallization patterns 108, 114, 120, 124, 128, 132 have line portions (also referred to as conductive lines) on and extending laterally along major surfaces of respective ones of the dielectric layers 106, 110, 116, 122, 126, 130, 134. The metallization patterns 108, 114, 120, 124, 128, 132 may also have via portions (also referred to as conductive vias) extending through respective ones of the dielectric layers 106, 110, 116, 122, 126, 130, 134. The redistribution structure 52 is shown as an example having six layers of metallization patterns. More or fewer dielectric layers and metallization patterns may be formed in the redistribution structure 52 by, respectively, repeating or omitting the steps and process discussed herein.

As discussed further below, some of the metallization patterns 108, 114, 120, 124, 128, 132 include, among other conductive features, grounding features and transmission lines. The transmission lines carry data signals for the semiconductor device 56. In some embodiments, the transmission lines are used for serial communications, particularly when the package component 50 is a large package, such as a package that is greater than 50 mm to 80 mm square. Respective pairs of transmission lines may be used for differential signaling, where a positive signal and a negative signal are used for each transmission, with the grounding features isolating adjacent pairs of transmission lines. The transmission lines electrically couple the semiconductor device 56 to the external connectors 66.

Figure 3:
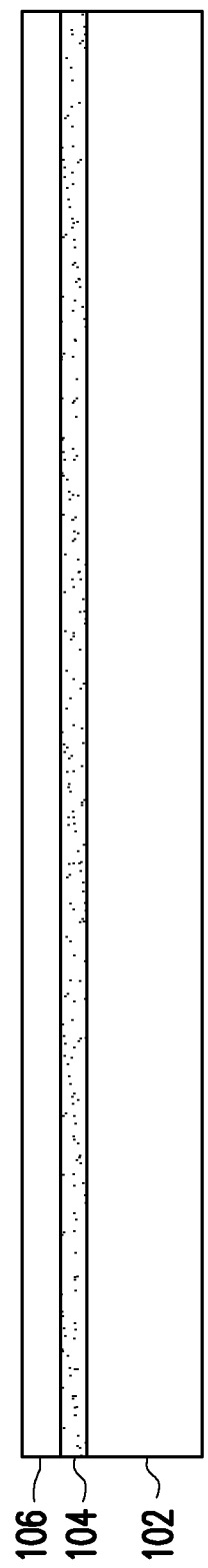

In FIG. 3, the dielectric layer 106 is deposited over the carrier substrate 102, e.g., on the release layer 104. The dielectric layer 106 may be a photo-sensitive material, such as a photo-sensitive polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 106 may be formed, for example, by spin coating, lamination, chemical vapor deposition (CVD), or the like. In some embodiments, the dielectric layer 106 is a photo-sensitive material.

Figure 4:
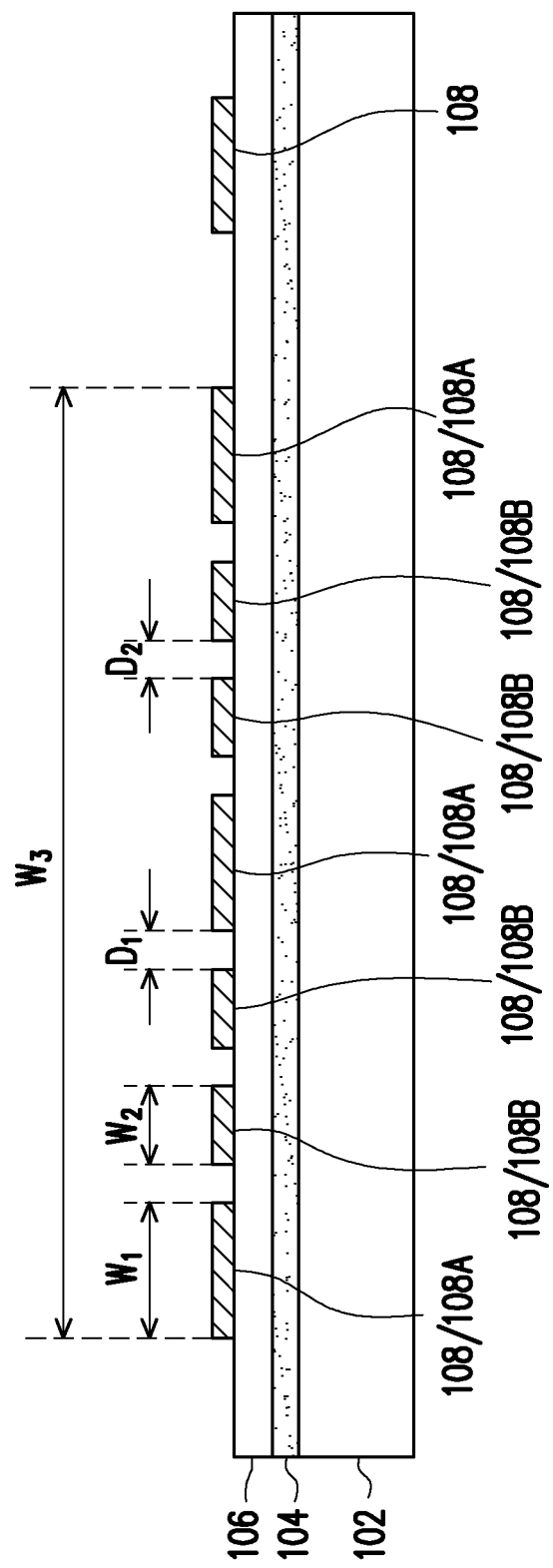

In FIG. 4, the metallization pattern 108 is formed on the dielectric layer 106. As an example to form the metallization pattern 108, a seed layer is formed over the dielectric layer 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 108. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 108. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The metallization pattern 108 includes, among other conductive features, grounding features 108A and transmission lines 108B. The grounding features 108A will be electrically coupled to a ground voltage node, and the transmission lines 108B will be electrically coupled to input/output terminals of the semiconductor device 56. Each pairs of transmission lines 108B is disposed between a pair of grounding features 108A.

Because the metallization pattern 108 is formed by photolithography and plating techniques, the grounding features 108A and transmission lines 108B are small. The grounding features 108A have a first width $W_1$, such as a width $W_1$ in the range of about 5 µm to about 500 µm, such as about 35 µm. The transmission lines 108B have a second width $W_2$, such as a width $W_2$ in the range of about 1 µm to about 50 µm, such as about 25 µm. The width $W_1$ is greater than the width $W_2$, but is greater by a small amount. For example, the width $W_1$ can be less than twice the width $W_2$. Further, the grounding features 108A and transmission lines 108B are formed close to one another. The grounding features 108A are separated from adjacent transmission lines 108B by a first distance $D_1$, such as a distance $D_1$ in the range of about 2 μm to about 100 μm, such as about 15 μm. Pairs of transmission lines 108B are separated by a second distance $D_2$, such as a distance $D_2$ in the range of about 2 μm to about 100 μm, such as about 35 μm. The distance $D_2$ is greater than the distance $D_1$, and can be more than twice the distance $D_1$. Finally, a complete set of communications features, including a first pair of transmission lines 108B (e.g., transmit signal lines), a second pair of transmission lines 108B (e.g., receive signal lines), and their corresponding grounding features 108A, may be formed to a small width $W_3$, such as a width $W_3$ in the range of about 30 μm to about 2000 μm, such as about 300 μm. Forming the grounding features 108A and transmission lines 108B to small sizes and with small separation distances allows both types of transmission lines 108B (e.g., transmit signal lines and receive signal lines) to be formed in the same layer of the redistribution structure 52. The quantity of layers of metallization patterns in the redistribution structure 52 may thus be reduced, allowing for lower manufacturing costs of the package component 50.

Figure 5:
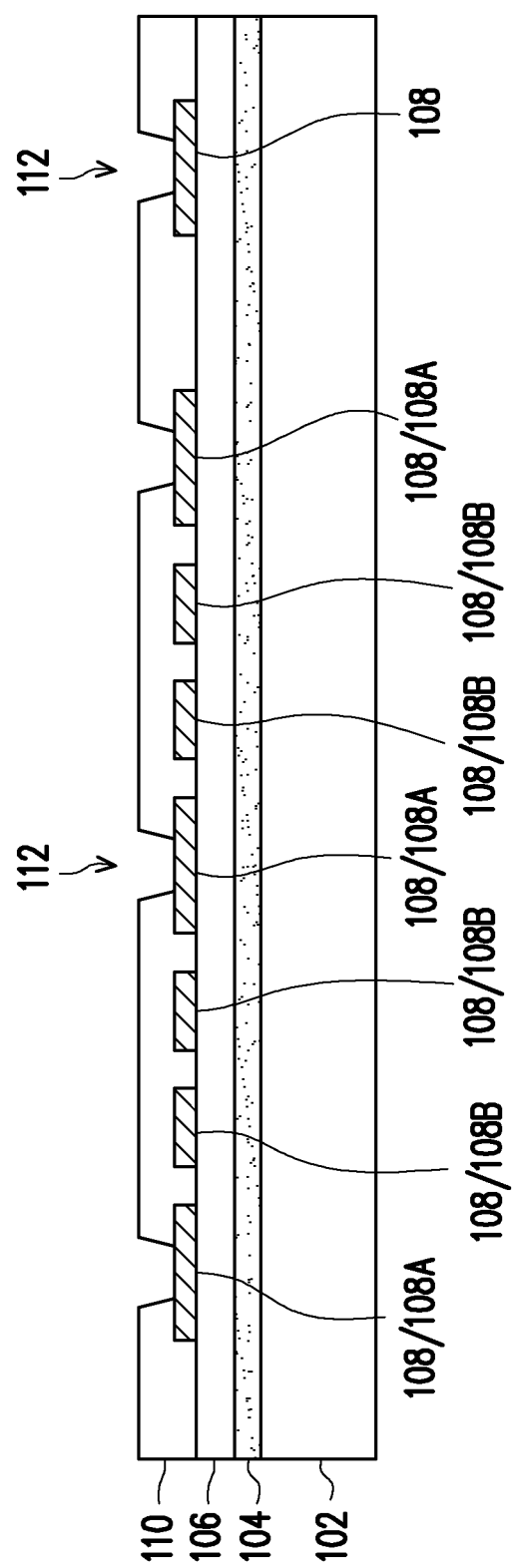

In FIG. 5, the dielectric layer 110 is deposited on the metallization pattern 108 and dielectric layer 106. The dielectric layer 110 may be formed in a similar manner and of a similar material as the dielectric layer 106. In some embodiments, the dielectric layer 110 is a photo-sensitive material. The dielectric layer 110 is then patterned. The patterning forms openings 112 exposing portions of the metallization pattern 108. As discussed further below, the openings 112 can be formed with trench shapes (e.g., FIG. 16A) or via shapes (e.g., FIG. 16B), depending on the shapes of grounding features that will be subsequently formed. The openings 112 expose the grounding features 108A, but the transmission lines 108B remain covered by the dielectric layer 110. The patterning may be by an acceptable process, such as by exposing the dielectric layer 110 to light when the dielectric layer 110 is a photo-sensitive material or by etching using, for example, an anisotropic etch. If the dielectric layer 110 is a photo-sensitive material, the dielectric layer 110 can be developed after the exposure.

Figure 6:
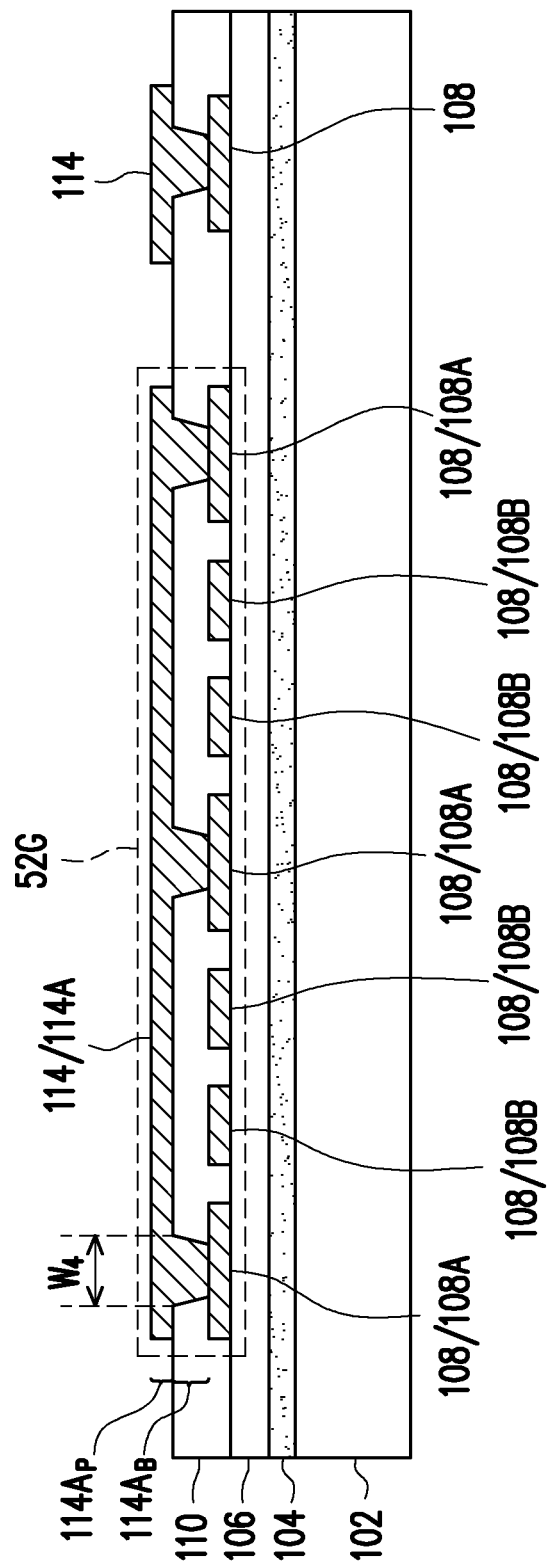

In FIG. 6, the metallization pattern 114 is formed to physically and electrically couple the metallization pattern 108. The metallization pattern 114 is formed over the dielectric layer 110 and in the openings 112 extending through the dielectric layer 110. The metallization pattern 114 may be formed in a similar manner and of a similar material as the metallization pattern 108.

The metallization pattern 114 includes, among other conductive features, grounding features 114A. Each one of the grounding features 114A is physically and electrically coupled to at least three of the grounding features 108A, and covers at least two pairs of the transmissions lines 108B. The grounding features 108A and 114A together form a grounding structure 52G in the redistribution structure 52 Each of the features of the grounding structure 52G are connected to a ground voltage node. The three-dimensional shape of the grounding structure 52G will be discussed further below with respect to FIGS. 16A and 16B. The grounding structure 52G electrically isolates two pairs of the transmission lines 108B from each other and from surrounding conductive features. Each pair of the transmission lines 108B is laterally isolated from other pairs of the transmission lines 108B by one of the grounding features 108A. Further, each pair of transmission lines 108B is isolated from features in other layers of the redistribution structure 52 by the grounding features 114A. Increasing the isolation of the transmission lines 108B allows for an improvement in their electrical performance. For example, forming the grounding structure 52G around the transmission lines 108B may decrease their crosstalk by up to 5% and may decrease their insertion losses by up to 10%.

Figure 7:
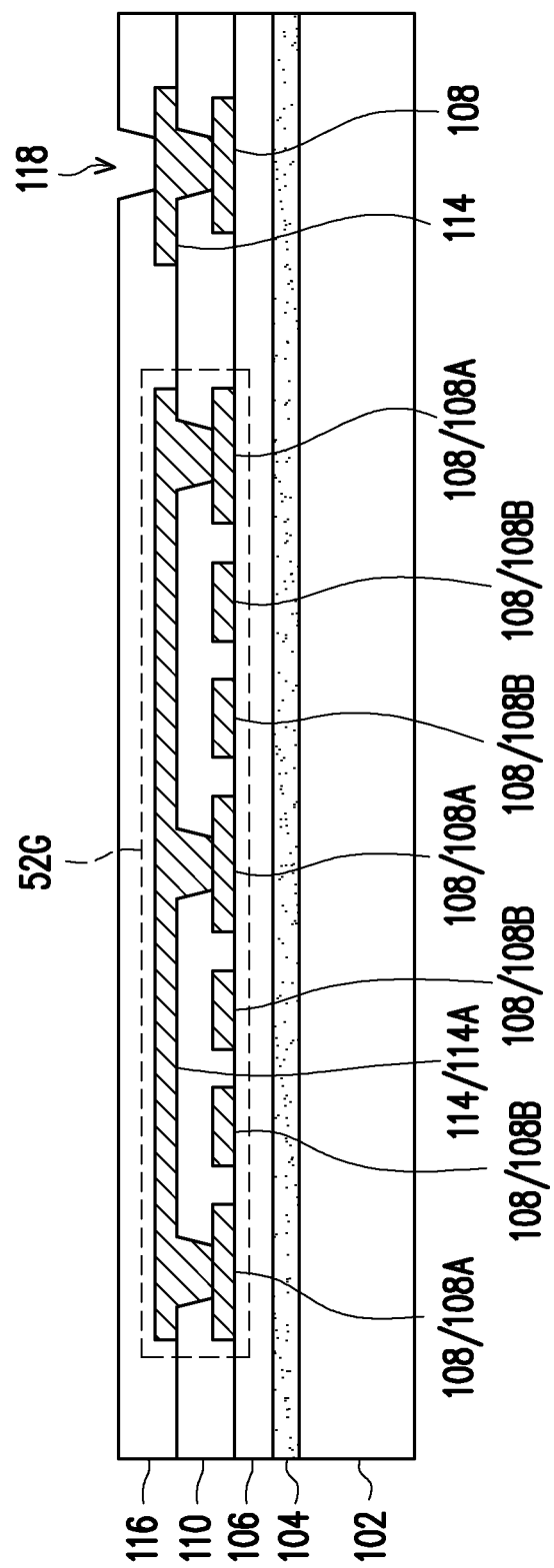

In FIG. 7, the dielectric layer 116 is deposited on the metallization pattern 114 and dielectric layer 110. The dielectric layer 116 may be formed in a similar manner and of a similar material as the dielectric layer 106. In some embodiments, the dielectric layer 116 is a photo-sensitive material. The dielectric layer 116 is then patterned with openings 118 exposing portions of the metallization pattern 114. The openings 118 may be formed in a manner similar to the openings 112.

Figure 8:
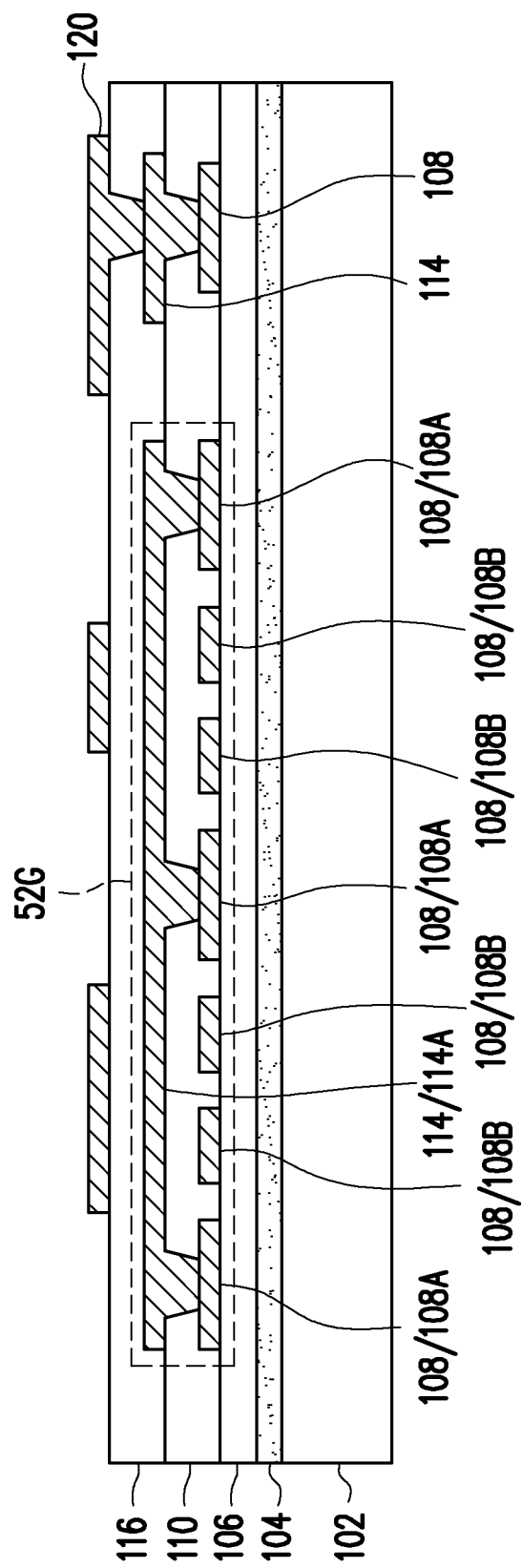

In FIG. 8, the metallization pattern 120 is formed to physically and electrically couple the metallization pattern 114. The metallization pattern 120 is formed over the dielectric layer 116 and in the openings 118 extending through the dielectric layer 116. The metallization pattern 120 may be formed in a similar manner and of a similar material as the metallization pattern 108.

Figure 9:
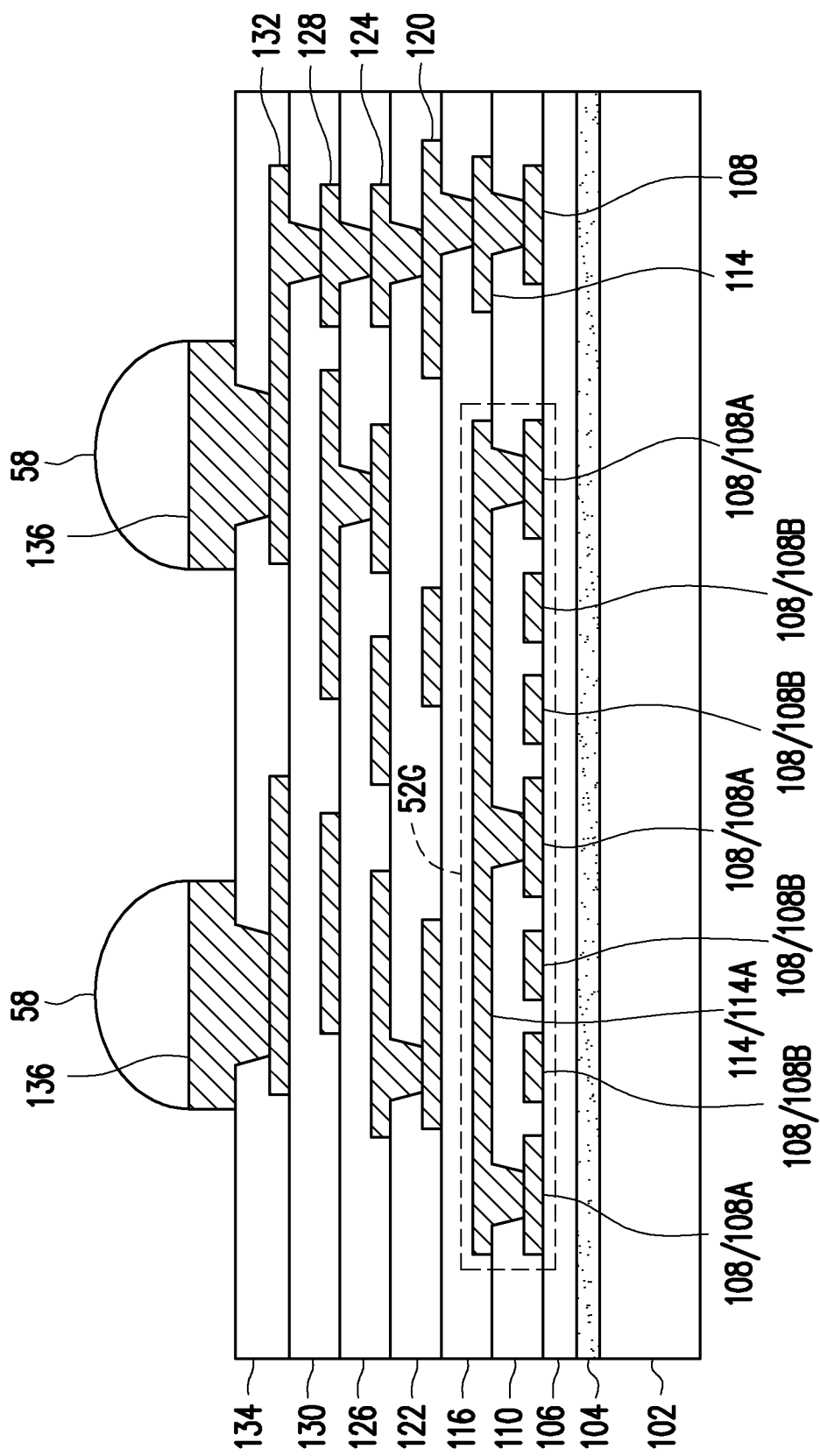

In FIG. 9, some of the steps and process discussed above are repeated to form the dielectric layers 122, 126, 130, 134; and to form the metallization patterns 124, 128, 132. The dielectric layers 122, 126, 130, 134 may be formed in a similar manner and of a similar material as the dielectric layer 106. In some embodiments, the dielectric layers 122, 126, 130, 134 are each a photo-sensitive material. The metallization patterns 124, 128, 132 may be formed in a similar manner and of a similar material as the metallization pattern 108.

Further, the UBMs 136 are formed for external connection to the redistribution structure 52. The UBMs 136 have bump portions on and extending laterally along the major surface of the dielectric layer 134, and have via portions extending through the dielectric layer 134 to physically and electrically couple the metallization pattern 132. As a result, the UBMs 136 are electrically coupled to the semiconductor device 56. The UBMs 136 may be formed in a similar manner and of a similar material as the metallization patterns 108, 114, 120 124, 128, 132. In some embodiments, the UBMs 136 have a different size than the metallization patterns 108, 114, 120 124, 128, 132.

Further, the conductive connectors 58 are formed on the UBMs 136. The conductive connectors 58 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 58 may include a conductive material such as solder, copper, aluminum, gold, nickel, silver, palladium, tin, the like, or a combination thereof. In some embodiments, the conductive connectors 58 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 58 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 10:
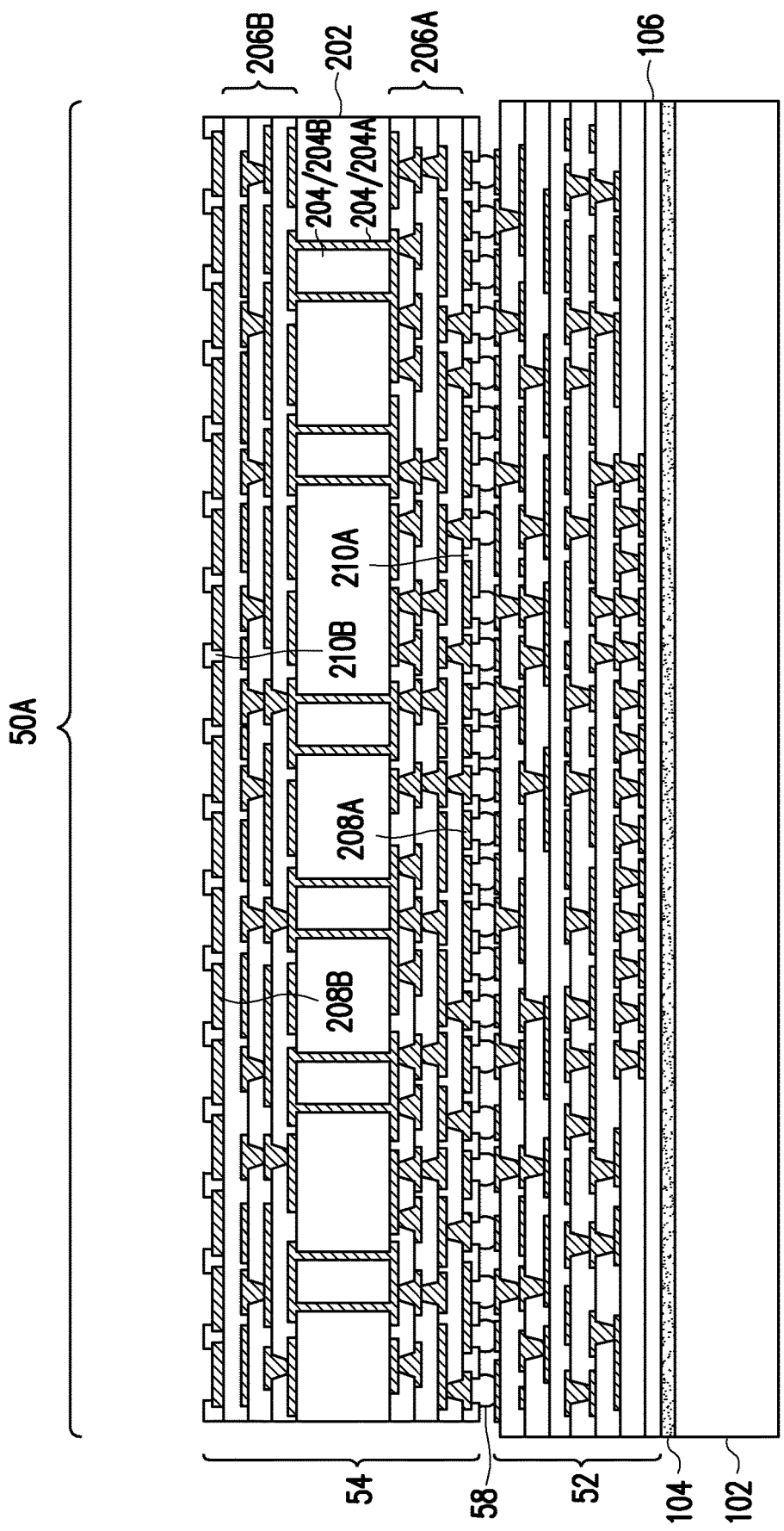

In FIG. 10, the interposer 54 is attached to the redistribution structure 52. The interposer 54 may be, e.g., an organic substrate, a ceramic substrate, a silicon substrate, or the like. The conductive connectors 58 are used to attach the interposer 54 to the redistribution structure 52. Attaching the interposer 54 may include placing the interposer 54 on the conductive connectors 58 and reflowing the conductive connectors 58 to physically and electrically couple the interposer 54 to the redistribution structure 52.

Before being attached, to the redistribution structure 52 the interposer 54 may be processed according to applicable manufacturing processes to form redistribution structures in the interposer 54. For example, the interposer 54 includes a substrate core 202. The substrate core 202 may be formed of glass fiber, resin, filler, other materials, and/or combinations thereof. The substrate core 202 may be formed of organic and/or inorganic materials. In some embodiments, the substrate core 202 includes one or more passive components (not shown) embedded inside. Alternatively, the substrate core 202 may comprise other materials or components. Conductive vias 204 are formed extending through the substrate core 202. The conductive vias 204 comprise a conductive material 204A such as copper, a copper alloy, or other conductors, and may include a barrier layer, liner, seed layer, and/or a fill material 204B, in some embodiments. The conductive vias 204 provide vertical electrical connections from one side of the substrate core 202 to the other side of the substrate core 202. For example, some of the conductive vias 204 are coupled between conductive features at one side of the substrate core 202 and conductive features at an opposite side of the substrate core 202. Holes for the conductive vias 204 may be formed using a drilling process, photolithography techniques, a laser process, or other methods, as examples, and the holes of the conductive vias 204 are then filled with conductive material. In some embodiments, the conductive vias 204 are hollow conductive through vias having centers that are filled with an insulating material. Redistribution structures 206A and 206B are formed on opposing sides of the substrate core 202. The redistribution structures 206A and 206B are electrically coupled by the conductive vias 204, and fan-out electrical signals. The redistribution structures 206A and 206B each include dielectric layers and metallization patterns. Each respective metallization pattern has line portions on and extend along the major surface of a respective dielectric layer, and has via portions extending through the respective dielectric layer. The redistribution structures 206A and 206B each, respectively, include UBMs 208A and 208B for external connection, and solder resists 210A and 210B protecting the features of the redistribution structures 206A and 206B. The redistribution structure 206A is attached to the redistribution structure 52 by the UBMs 208A.

Figure 11:
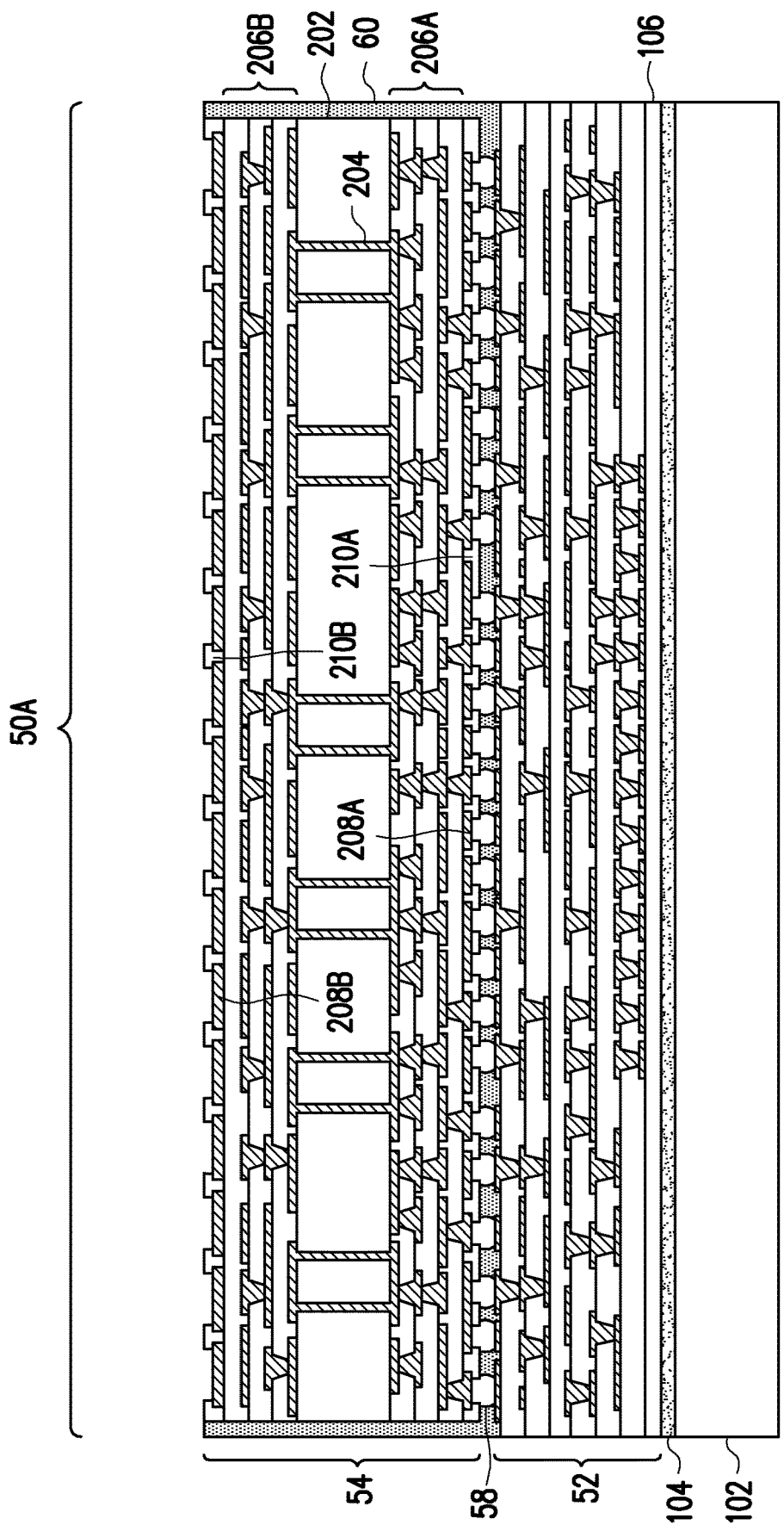

In FIG. 11, an underfill 60 may be formed surrounding the conductive connectors 58. The underfill 60 may reduce stress and protect the joints resulting from the reflowing of the conductive connectors 58. The underfill 60 may be formed by a capillary flow process after the interposer 54 is attached to the redistribution structure 52, or may be formed by a suitable deposition method before the interposer 54 is attached to the redistribution structure 52. The underfill 60 may be formed along sidewalls of the interposer 54.

Figure 12:
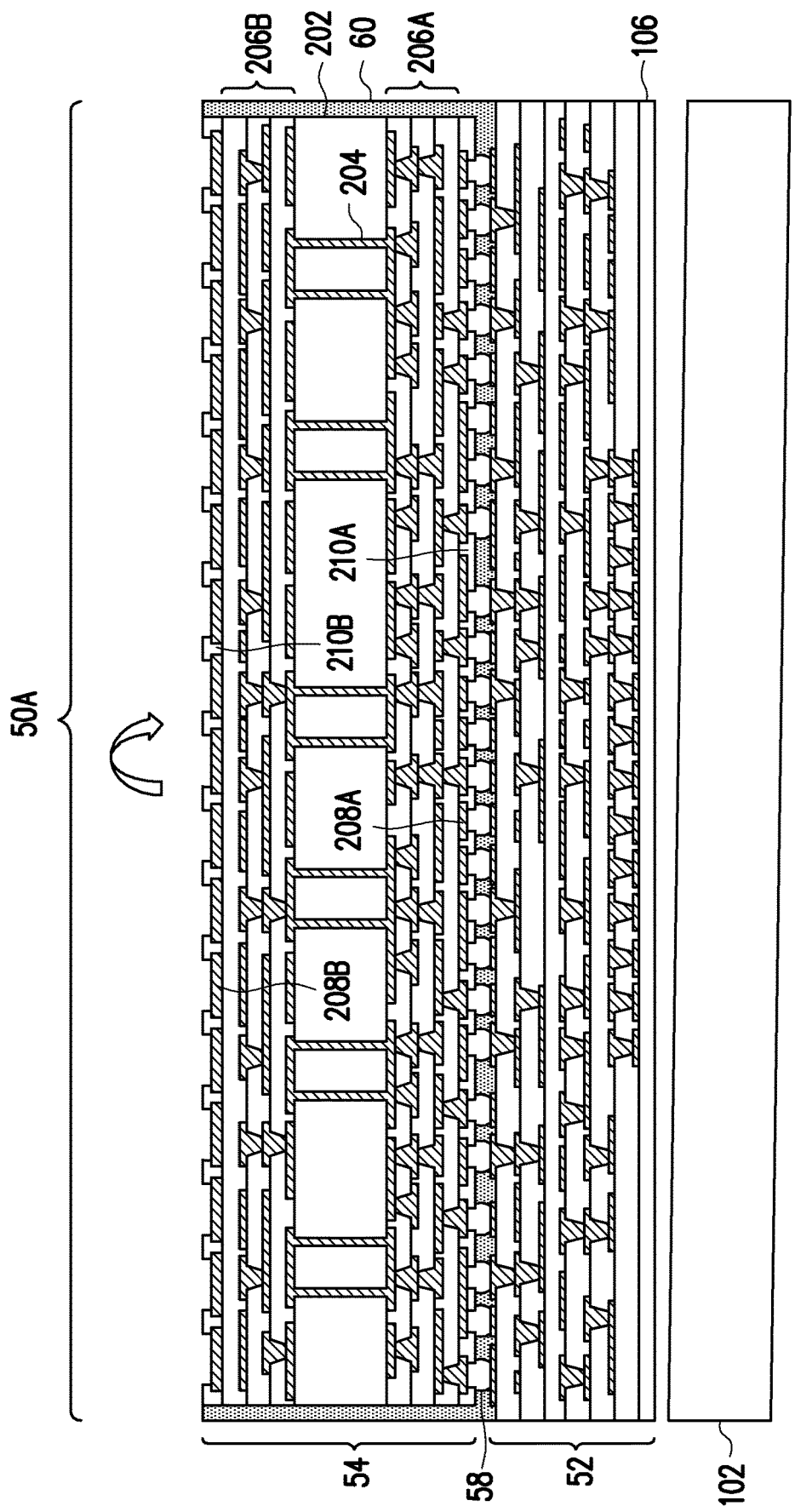

In FIG. 12, a carrier substrate de-bonding is performed to detach (or "de-bond") the carrier substrate 102 from the redistribution structure 52, e.g., from the dielectric layer 106. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 13:
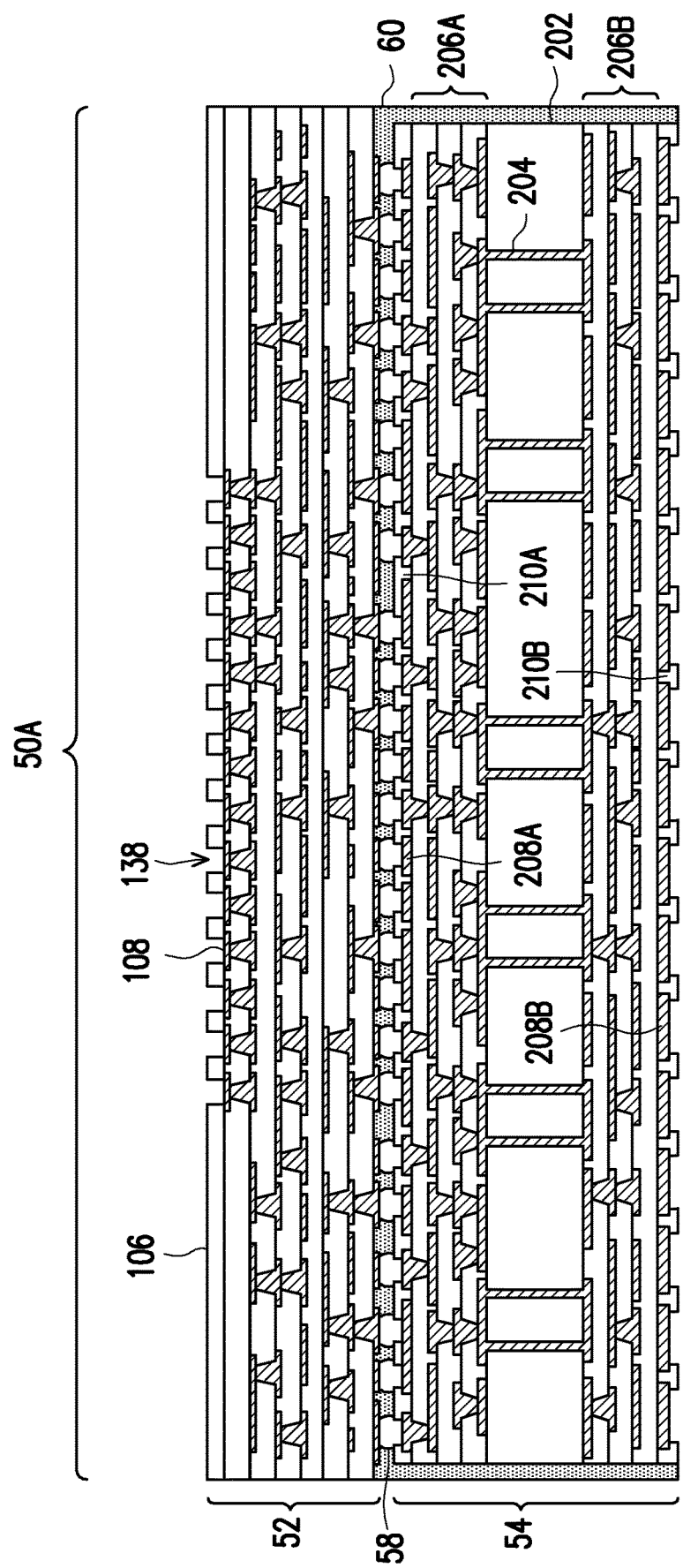

In FIG. 13, openings 138 are formed in the dielectric layer 106, exposing the metallization pattern 108. The openings 138 may be formed by a drilling process such as laser drilling, mechanical drilling, or the like.

Figure 14:
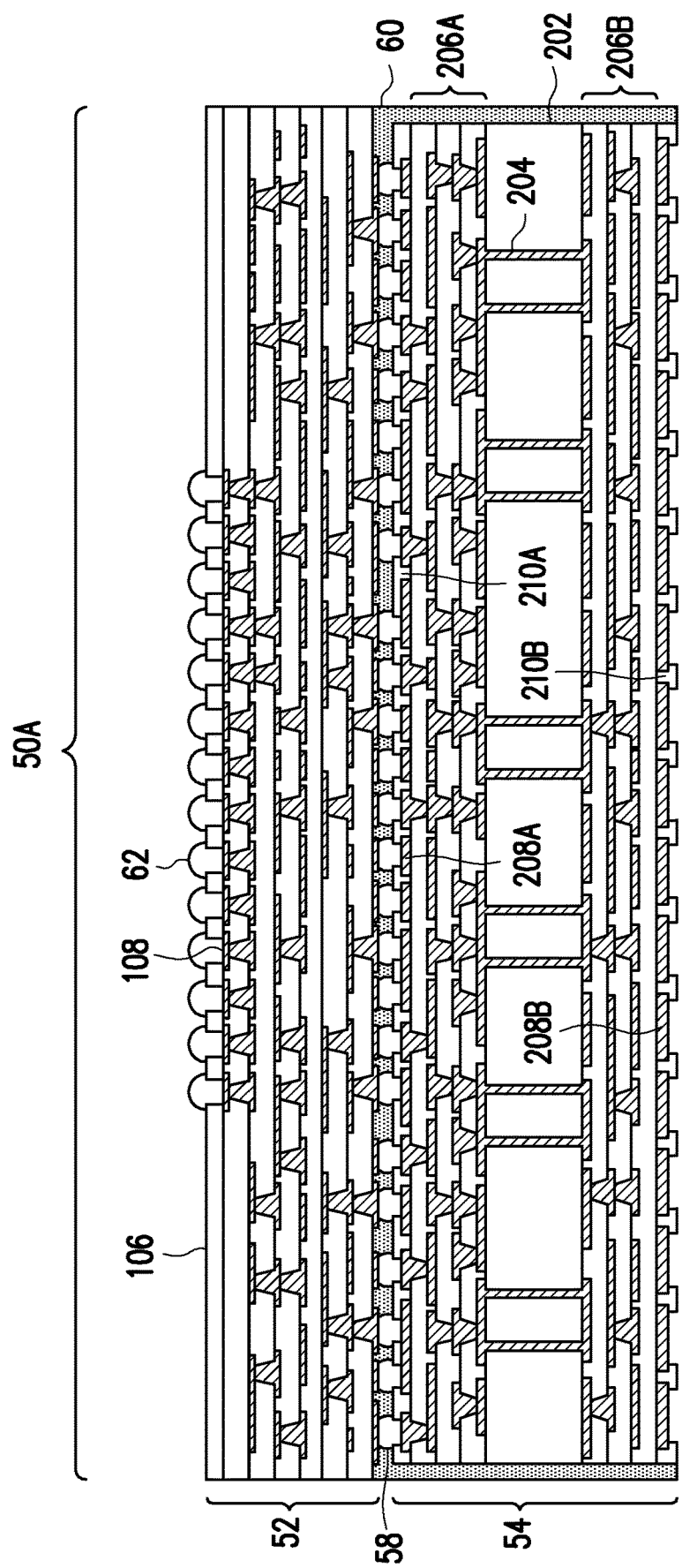

In FIG. 14, the conductive connectors 62 are formed in the openings 138, physically and electrically coupled to the exposed metallization pattern 108. The conductive connectors 62 may be ball grid array (BGA) connectors, solder balls, metal pillars, controlled collapse chip connection (C4) bumps, micro bumps, or the like. The conductive connectors 62 may include a conductive material such as solder, copper, aluminum, gold, nickel, silver, palladium, tin, the like, or a combination thereof. In some embodiments, the conductive connectors 62 are formed by initially forming a layer of reflowable material in the openings 138 through evaporation, electroplating, printing, solder transfer, ball placement, or the like. Once a layer of reflowable material has been formed in the openings 138, a reflow may be performed in order to shape the material into the desired bump shapes.

Figure 15:
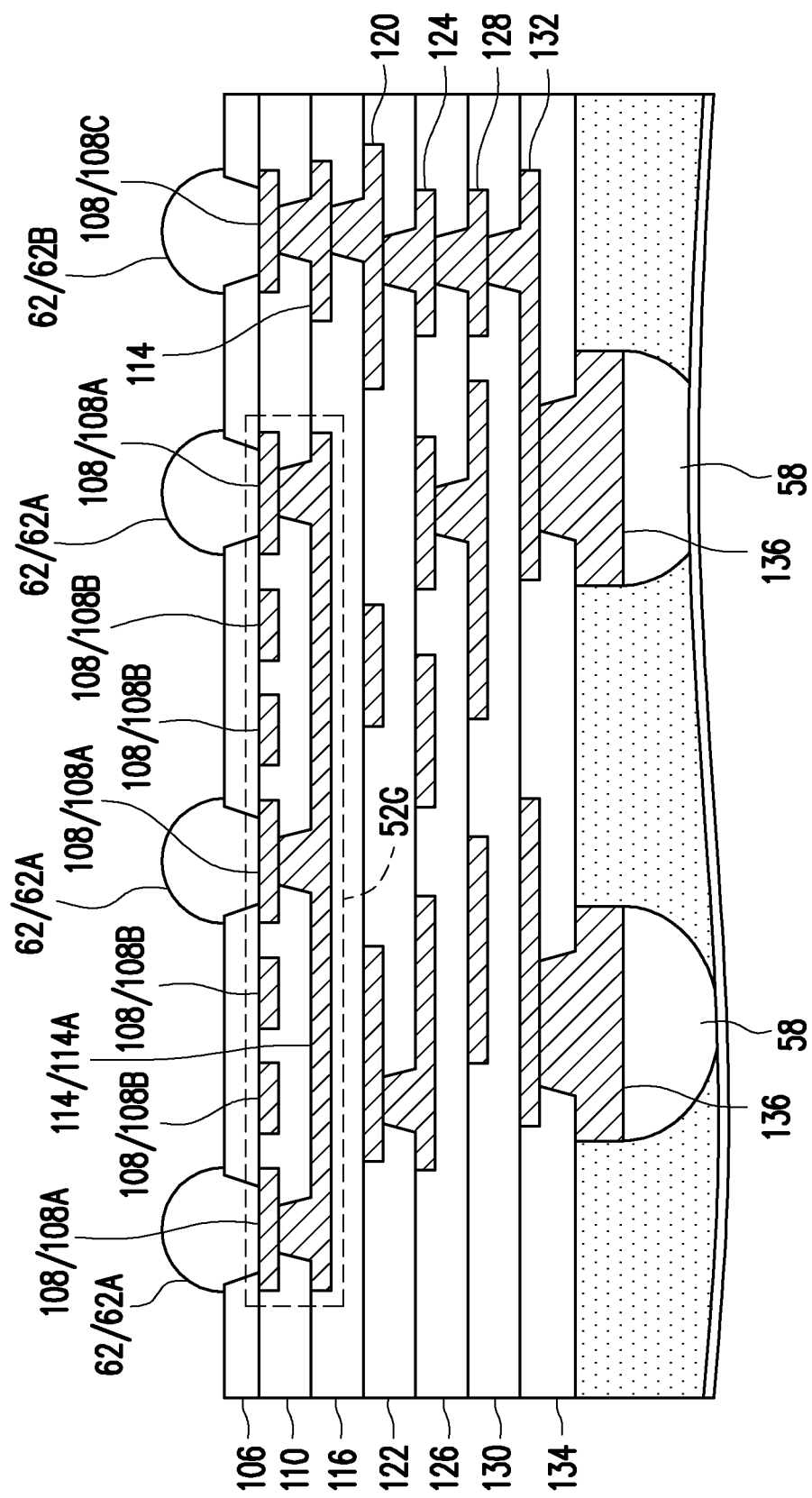
Figure 16A:
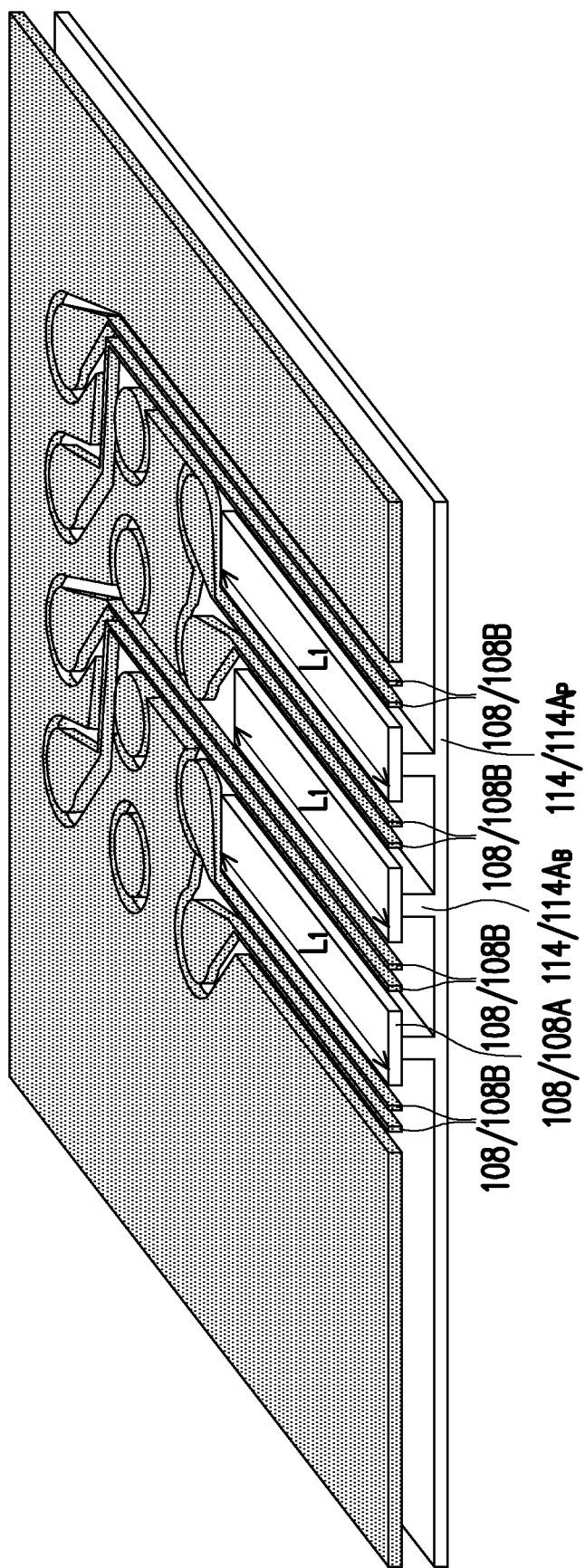
Figure 16B:
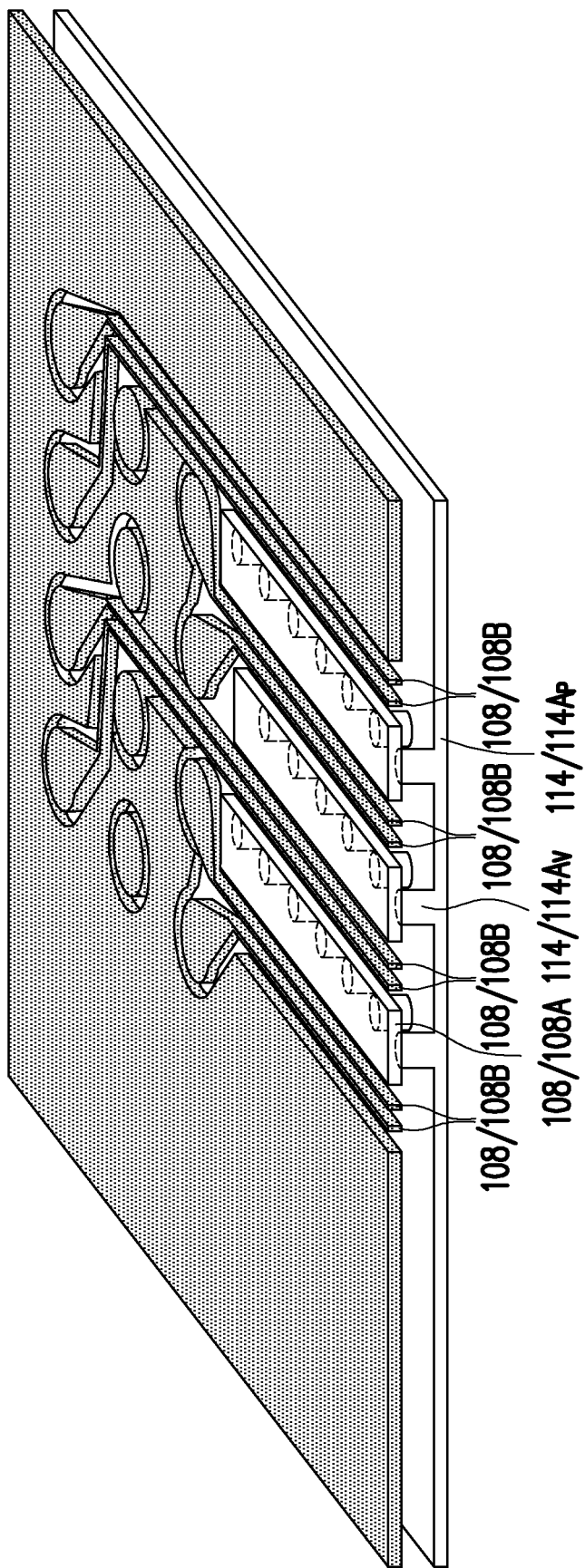

FIG. 15 is a detailed view of a region of the redistribution structure 52, after the conductive connectors 62 are formed in the openings 138. Some features in FIG. 14 are omitted from FIG. 15 for simplicity of illustration. As shown, a first subset of the conductive connectors 62A are connected to the grounding features 108A, and a second subset of the conductive connectors 62B are connected to other conductive features 108C of the metallization patterns 108.

FIG. 16A is a three-dimensional view showing some features of the metallization patterns 108 and 114, in accordance with some embodiments. FIG. 16A is described in conjunction with FIG. 15. Some features (e.g., dielectric layers) are omitted in FIG. 16A for clarity of illustration. Each ground feature 114A has a planar portion $114A_P$ and bar portions $114A_B$. The planar portion $114A_P$ extends continuously beneath the transmission lines 108B along the entire length of the transmission lines 108B. The bar portions $114A_B$ each connect the planar portion $114A_P$ to corresponding grounding features 108A. The bar portions $114A_B$ are formed in the openings 112 (see FIG. 5), which can be formed in an elongated trench shape. Each grounding feature 108A and its associated bar portion $114A_B$ has a length $L_1$. The length $L_1$ of each ground feature 108A and bar portion $114A_B$ pair is less than or equal to the lengths of their adjacent transmission lines 108B. Further, each ground feature 108A and bar portion $114A_B$ pair extend continuously along their respective lengths $L_1$, and can extend along a majority of the length of their adjacent transmission lines 108B. The transmission lines 108B are used for serial communications, and as such, the lengths $L_1$ can be long, such as in the range of about 5 μm to about 100 μm.

Because the metallization pattern 114 is formed by photolithography and plating techniques, the bar portions $114A_B$ are small. The bar portions $114A_B$ have a fourth width $W_4$, such as a width $W_4$ in the range of about 2 μm to about 100 μm, such as about 25 μm. The width $W_1$ of the grounding features 108A is larger than the width $W_4$ of the bar portions $114A_B$. For example, the width $W_1$ can be larger than the width $W_4$ by an amount in the range of about 1 μm to about 80 μm. Forming the bar portions $114A_B$ to small sizes allows for a reduction in the quantity of layers of metallization patterns in the redistribution structure 52. For example, the grounding structure 52G may be formed with as few as two layers. Manufacturing costs of the package component 50 may thus be reduced.

FIG. 16B is a three-dimensional view showing some features of the metallization patterns 108 and 114, in accordance with some other embodiments. FIG. 16B is described in conjunction with FIG. 15. Some features (e.g., dielectric layers) are omitted in FIG. 16B for clarity of illustration. Each ground feature 114A has a planar portion $114A_P$ and via portions $114A_V$. The planar portion $114A_P$ extends continuously beneath the transmission lines 108B along the entire length of the transmission lines 108B. The via portions $114A_V$ each connect the planar portion $114A_P$ to corresponding grounding features 108A. The via portions $114A_V$ are formed in the openings 112 (see FIG. 5), which can be formed in a rounded via shape. Similar to the embodiment of FIG. 16A, each grounding feature 108A has a length $L_1$. The via portions $114A_V$ are spaced out along the lengths $L_1$ of the grounding features 108A. The via portions $114A_V$ can be spaced apart at a regular or irregular period. Each of the via portions $114A_V$ can have the same width, or can have different widths.

Because the metallization pattern 114 is formed by photolithography and plating techniques, the via portions $114A_V$ are small. The via portions $114A_V$ can have a width $W_4$ in the range of about 2 μm to about 100 μm, such as about 25 μm. The width $W_1$ of the grounding features 108A is larger than the width $W_4$ of the via portions $114A_V$. For example, the width $W_1$ can be larger than the width $W_4$ by an amount in the range of about 1 μm to about 80 μm. Forming the via portions $114A_V$ to small sizes allows for a reduction in the quantity of layers of metallization patterns in the redistribution structure 52. For example, the grounding structure 52G may be formed with as few as two layers. Manufacturing costs of the package component 50 may thus be reduced.

Figure 17:
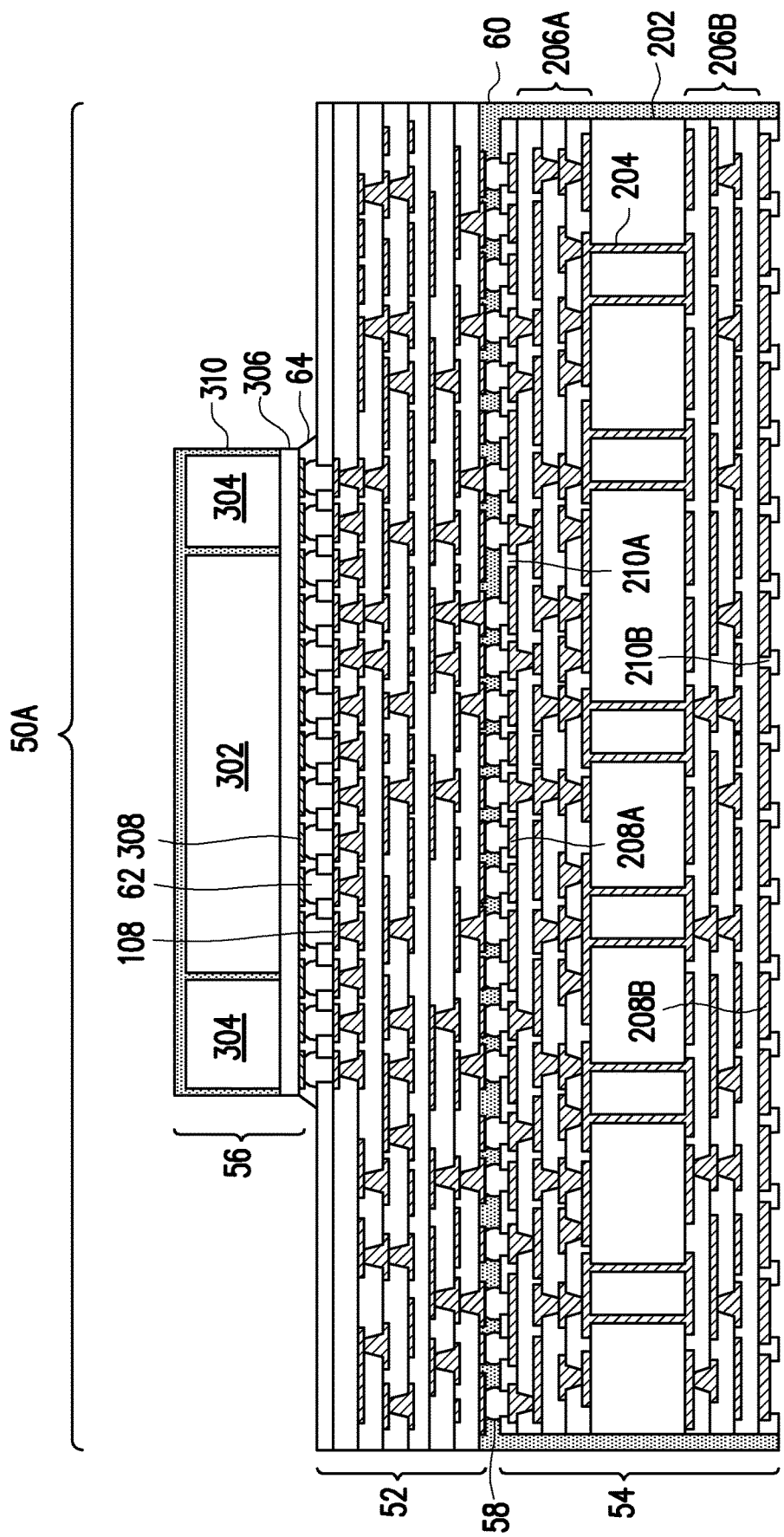

In FIG. 17, the semiconductor device 56 is attached to the redistribution structure 52, opposite the interposer 54. In some embodiments, the semiconductor device 56 is a package that includes one or more integrated circuit dies for forming a computing system. In the embodiment shown, the semiconductor device 56 includes a logic die 302 and memory devices 304. The logic die 302 may be, e.g., a central processing unit (CPU), graphics processing unit (GPU), system-on-a-chip (SoC), application processor (AP), microcontroller, or the like. The memory devices 304 may be, e.g., dynamic random access memory (DRAM) dies, static random access memory (SRAM) dies, hybrid memory cube (HMC) devices, high bandwidth memory (HBM) devices, or the like. The logic die 302 and memory devices 304 are attached to and interconnected by a redistribution structure 306. The redistribution structure 306 may be, e.g., an interposer or the like, and has connectors 308 for external connection. An encapsulant 310 may be formed over the redistribution structure 306 and around the logic die 302 and memory devices 304, thereby protecting the various components of the semiconductor device 56.

The conductive connectors 62 are used to attach the connectors 308 of the semiconductor device 56 to the metallization pattern 108 of the redistribution structure 52, such as to the grounding features 108A (see FIG. 15). Attaching the semiconductor device 56 may include placing the semiconductor device 56 on the conductive connectors 62 and reflowing the conductive connectors 62 to physically and electrically couple the semiconductor device 56 to the redistribution structure 52.

In some embodiments, an underfill 64 is formed surrounding the conductive connectors 62. The underfill 64 may reduce stress and protect the joints resulting from the reflowing of the conductive connectors 62. The underfill 64 may be formed by a capillary flow process after the semiconductor device 56 is attached to the redistribution structure 52, or may be formed by a suitable deposition method before the semiconductor device 56 is attached to the redistribution structure 52.

Figure 18:
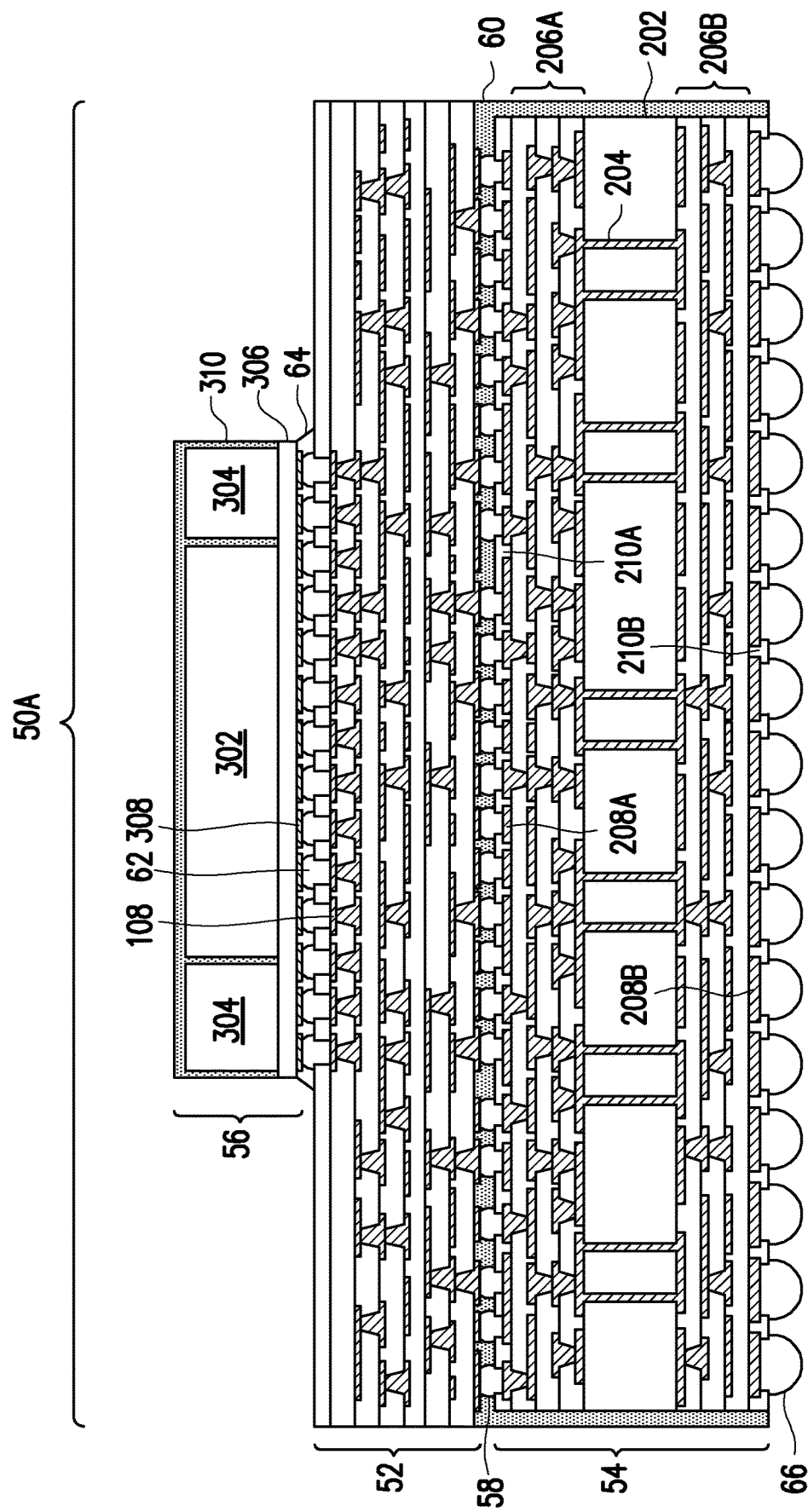

In FIG. 18, the external connectors 66 are formed on the UBMs 208B. The external connectors 66 may be ball grid array (BGA) connectors, solder balls, metal pillars, controlled collapse chip connection (C4) bumps, micro bumps, or the like. The external connectors 66 may include a conductive material such as solder, copper, aluminum, gold, nickel, silver, palladium, tin, the like, or a combination thereof. In some embodiments, the external connectors 66 are formed by initially forming a layer of reflowable material on the UBMs 208B through evaporation, electroplating, printing, solder transfer, ball placement, or the like. Once a layer of reflowable material has been formed on the UBMs 208B, a reflow may be performed in order to shape the material into the desired bump shapes.

Figure 19:
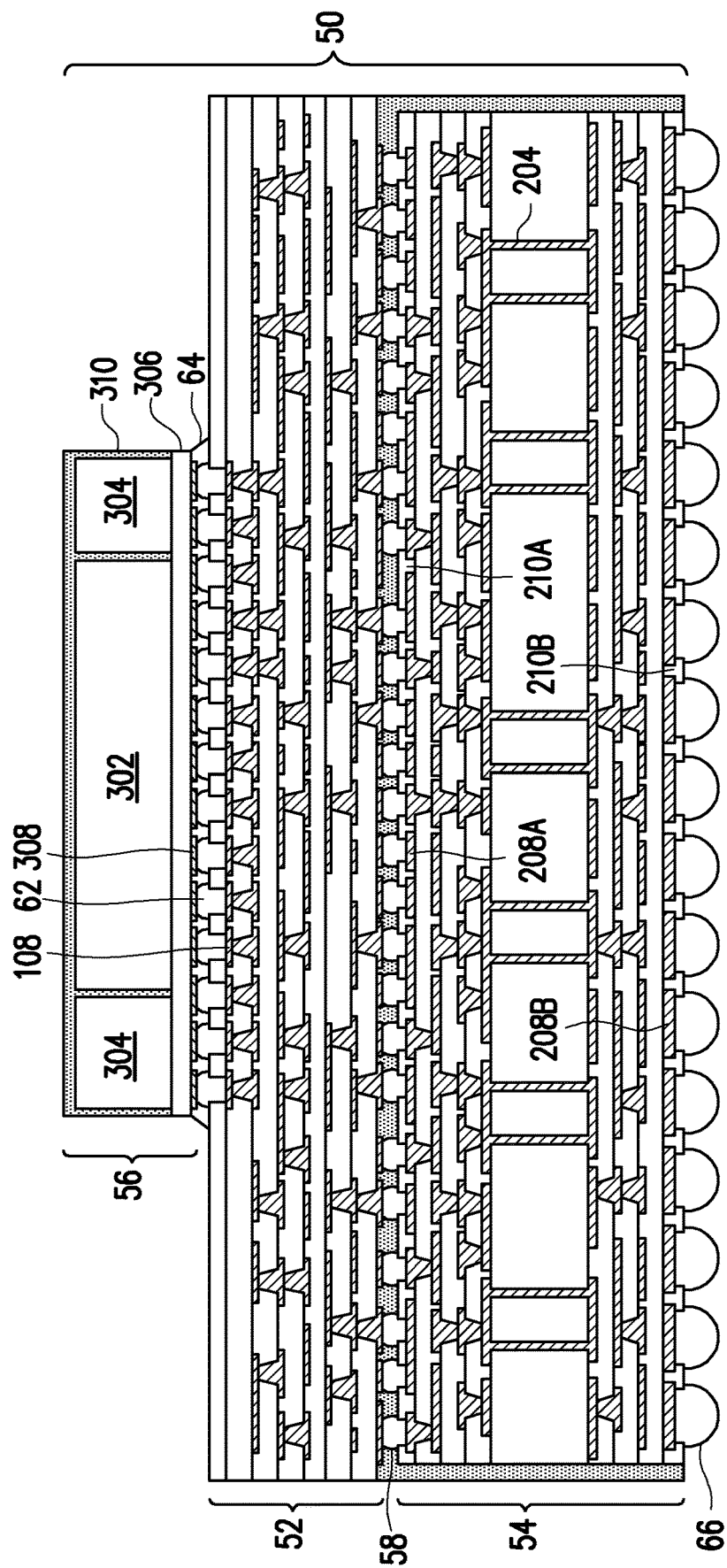
FIG. 19 is a cross-sectional view of a resulting package component, in accordance with some embodiments.
Figure 20:
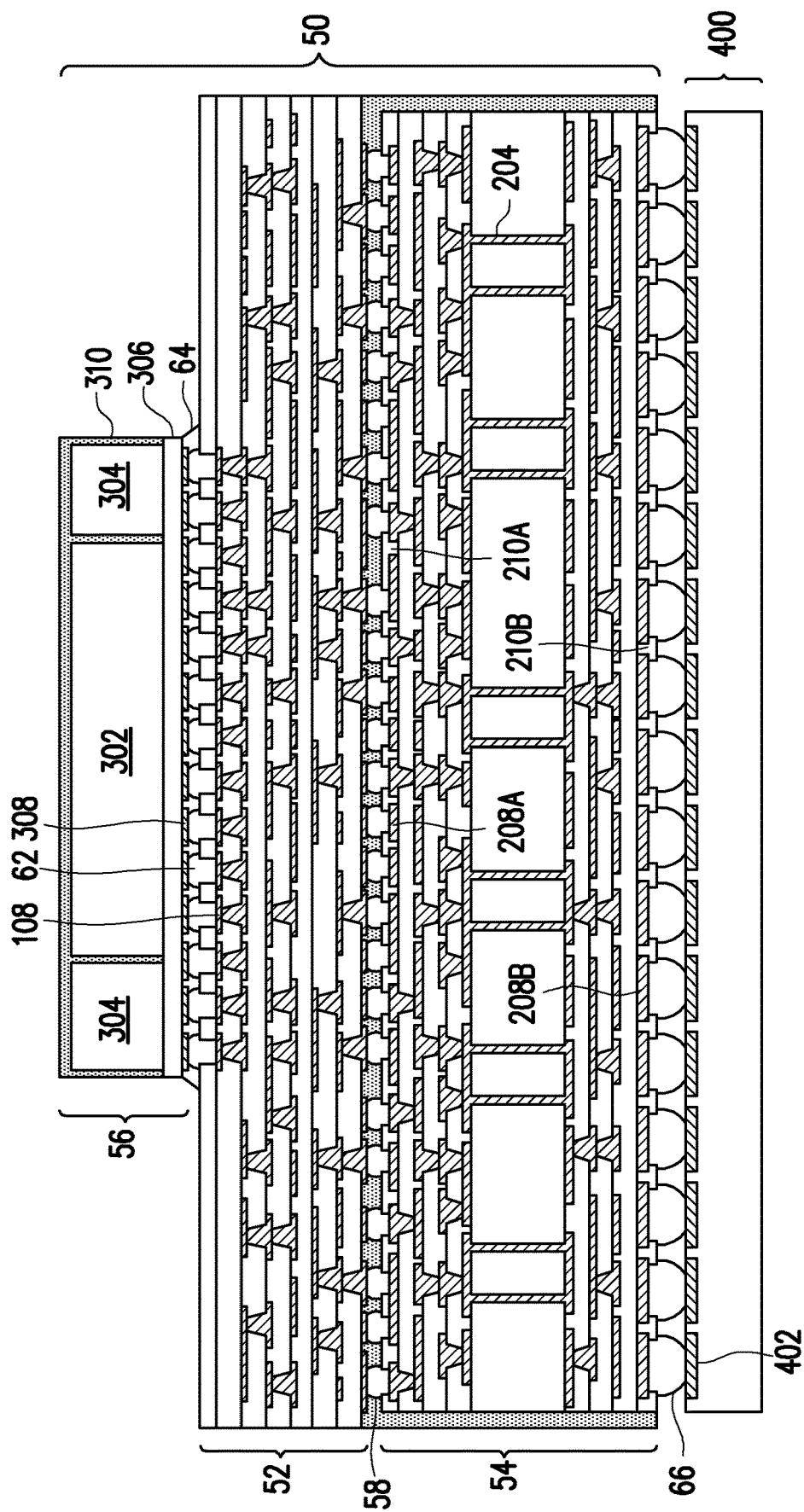
FIG. 20 is a cross-sectional view of a system including a package component, in accordance with some embodiments.

FIG. 19 is a cross-sectional view of the resulting package component 50. The first package region 50A may be singulated to form the package component 50 at several possible steps of processing. For example, singulation can be performed before or after the semiconductor device 56 is attached. After singulation, some of the underfill 60 may remain on sidewalls of the interposer 54.

FIG. 20 is a cross-sectional view of a system including a package component 50, in accordance with some embodiments. In this embodiment, the package component 50 is mounted to a printed circuit board (PCB) 400 using the external connectors 66. The PCB 400 includes an insulating substrate and conductive traces. The insulating substrate may be based on an insulating core such as a fiberglass reinforced resin core. One example core material is fiberglass resin such as FR4. Alternatives for the core material include bismaleimide-triazine BT resin, or alternatively, other laminates or films. For example, build up films such as ABF may be used to form the insulating substrate. The insulating substrate may be formed of multiple layers. The conductive traces include conductive lines and vias, and are formed on and/or between layers of the insulating substrate. The conductive traces may be formed of copper, aluminum, titanium, tungsten, or the like. Some or all of the conductive traces may penetrate through the PCB 400. The conductive traces are for routing signals, such as data signals, power signals, ground voltage, etc., which are electrically connected to bond pads 402. For example, some of the bond pads 402 electrically connect ground voltage traces to the grounding structure(s) 52G (see FIG. 15) in the redistribution structure 52. The PCB 400 may be single-sided, with conductive traces formed only on the top side of the PCB 400, or may be double-sided, with conductive traces formed on both the top side and the bottom side of the PCB 400.

In some embodiments, the external connectors 66 are reflowed to attach the package component 50 to the bond pads 402. The external connectors 66 electrically and/or physically couple the PCB 400, including the conductive traces in the PCB 400, to the package component 50. In some embodiments, passive devices (e.g., surface mount devices) may be attached to the package component 50 (e.g., bonded to the external connectors 66) or may be attached to the PCB 400 (e.g., bonded to the bond pads 402).

The external connectors 66 may have an epoxy flux (not shown) formed thereon before they are reflowed with at least some of the epoxy portion of the epoxy flux remaining after the package component 50 is attached to the PCB 400. This remaining epoxy portion may act as an underfill to reduce stress and protect the joints resulting from the reflowing the external connectors 66. In some embodiments, an underfill (not shown) may be formed between the package component 50 and the PCB 400, surrounding the external connectors 66. The underfill may be formed by a capillary flow process after the package component 50 is attached or may be formed by a suitable deposition method before the package component 50 is attached.

In the embodiment of FIGS. 3 through 9, the grounding structure 52G is illustrated as being formed in the bottommost two layers of the redistribution structure 52. It should be appreciated that the grounding structure 52G may be formed in other layers of the redistribution structure 52. Further, multiple grounding structures 52G may be formed in different layers of the redistribution structure 52.

Figure 21:
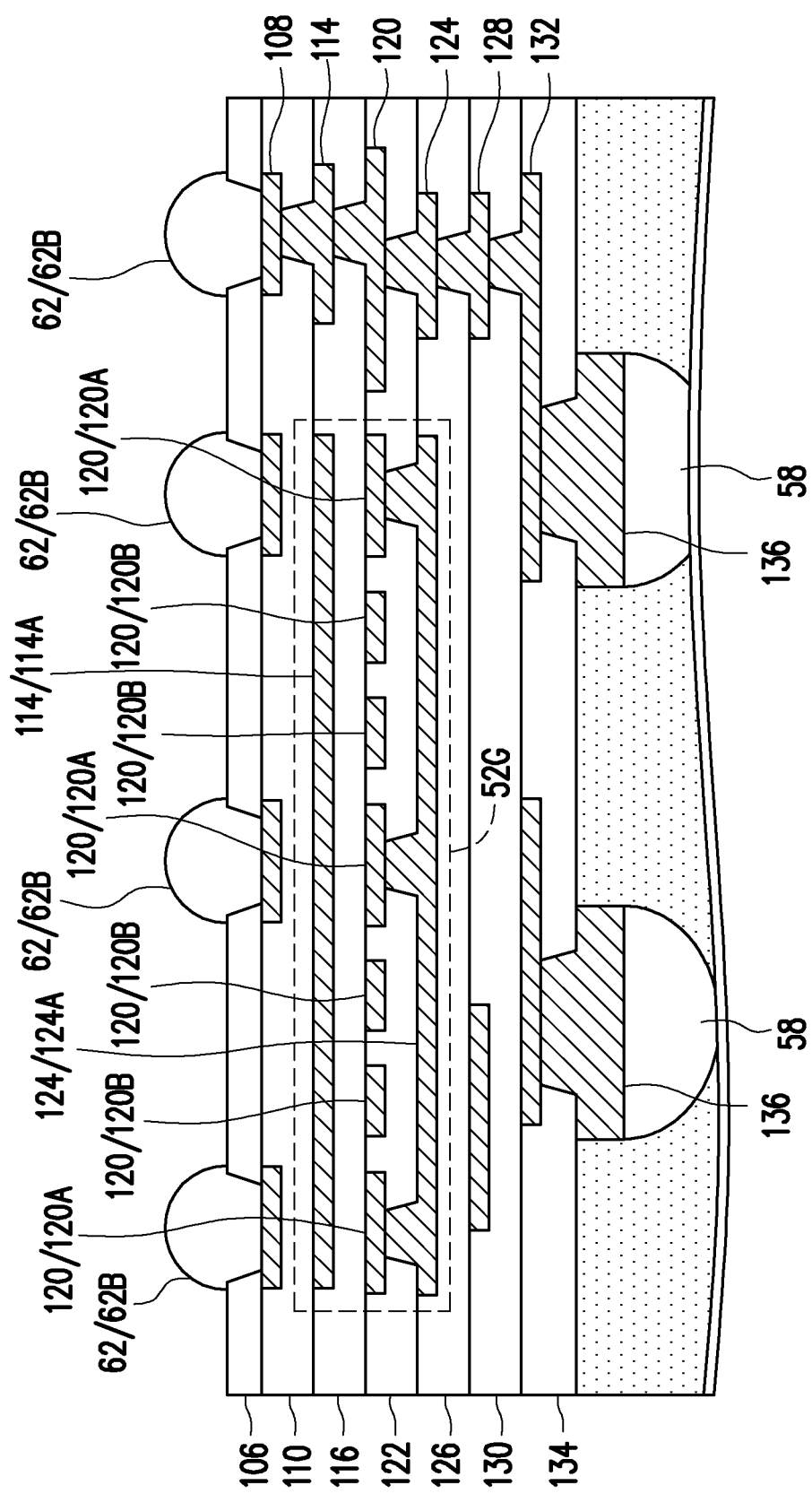
FIGS. 21 through 22B are various views of a package component, in accordance with some other embodiments.
Figure 22A:
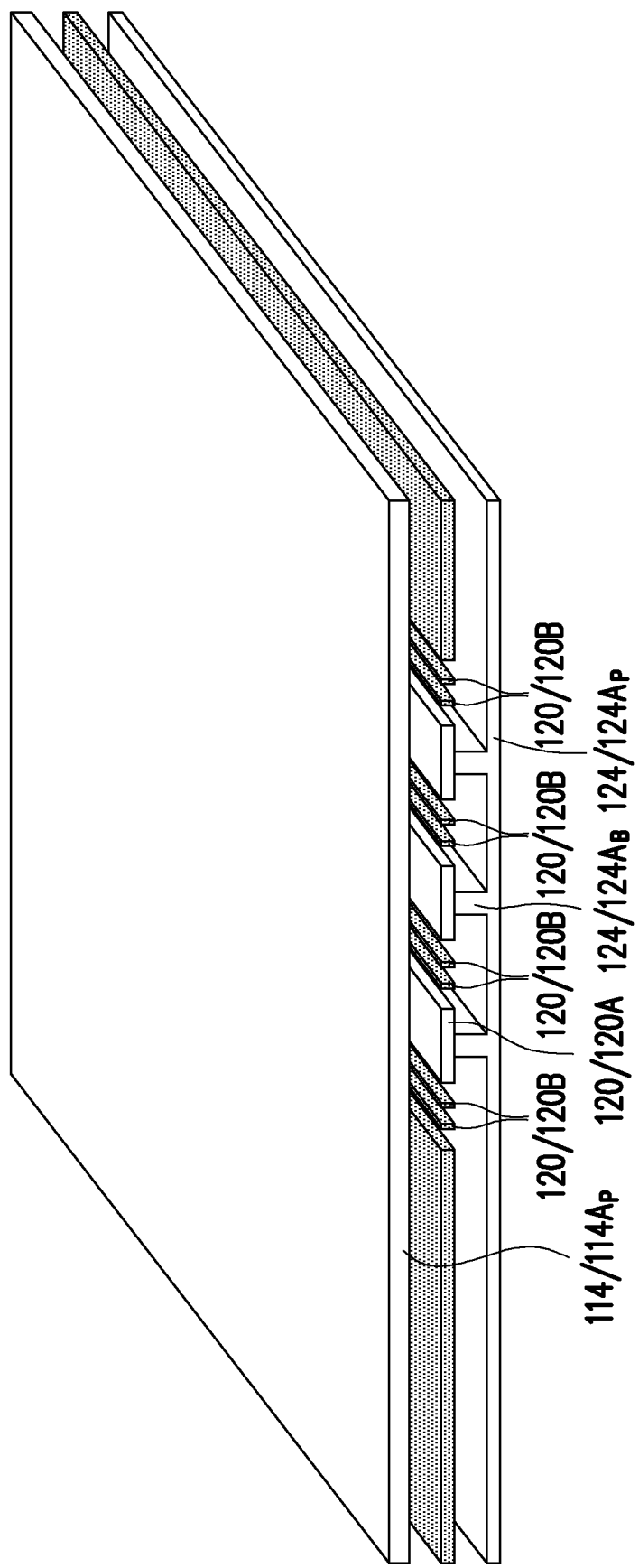
Figure 22B:
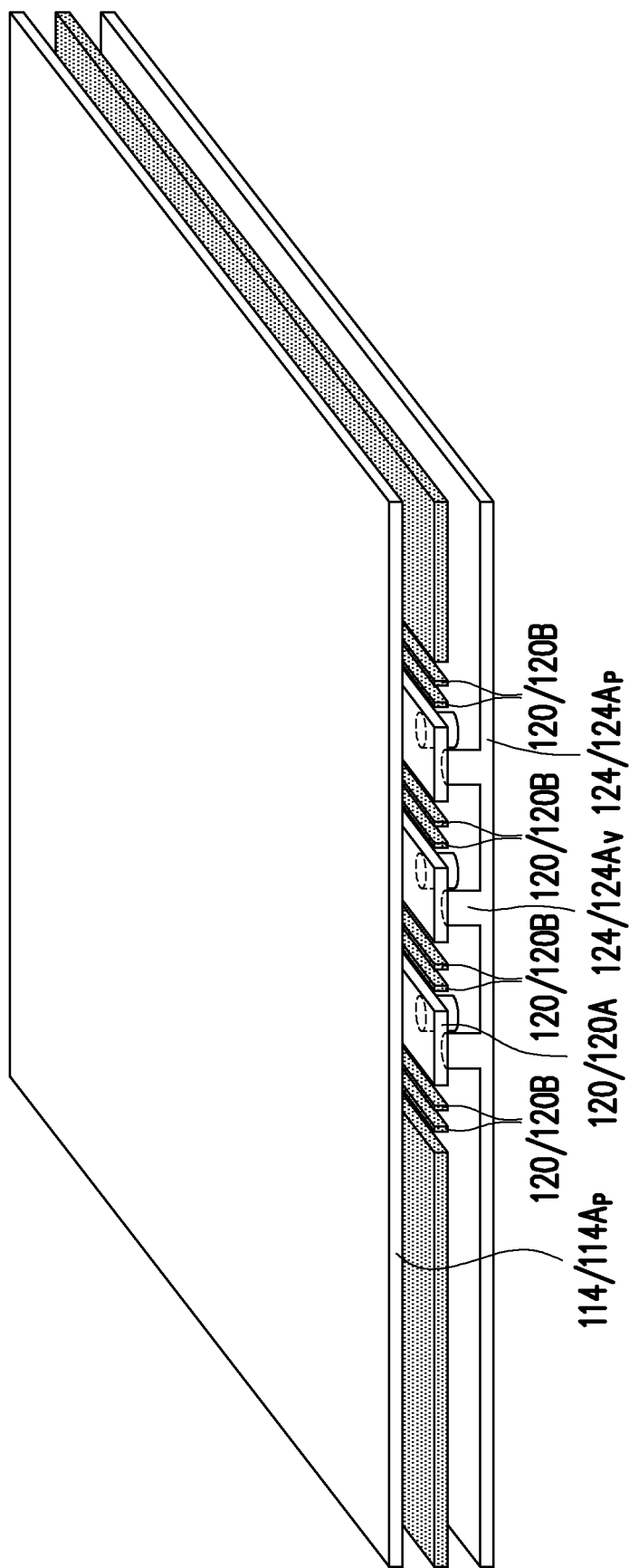

FIGS. 21 through 22B are various views of the redistribution structure 52, in accordance with some other embodiments. FIG. 21 is a cross-sectional view, and FIGS. 22A and 22B are three-dimensional views. Some features (e.g., dielectric layers) are omitted in FIGS. 22A and 22B for clarity of illustration. In these embodiments, the grounding structure 52G is formed among three intermediate layers of the redistribution structure 52. The metallization pattern 114 includes grounding features 114A. The metallization pattern 120 includes grounding features 120A and transmission lines 120B, with the grounding features 120A being similar to the grounding features 108A (see FIG. 15) and the transmission lines 120B being similar to the transmission lines 108B (see FIG. 15). The metallization pattern 124 includes grounding features 124A, with the grounding features 124A being similar to the grounding features 114A (see FIG. 15). Each ground feature 124A has a planar portion $124A_P$, and either has bar portions $124A_B$ (see FIG. 22A) or via portions $124A_V$ (see FIG. 22B) extending laterally along the transmission lines 120B. The grounding features 114A provide an additional grounding plane $114A_P$ that extends parallel to the planar portion $124A_P$ of the grounding feature 124A (see FIG. 23), and provides additional shielding to the transmission lines 120B. For example, the transmission lines 120B are horizontally disposed between the grounding features 120A, and are vertically disposed between the grounding features 114A and 124A.

Figure 23:
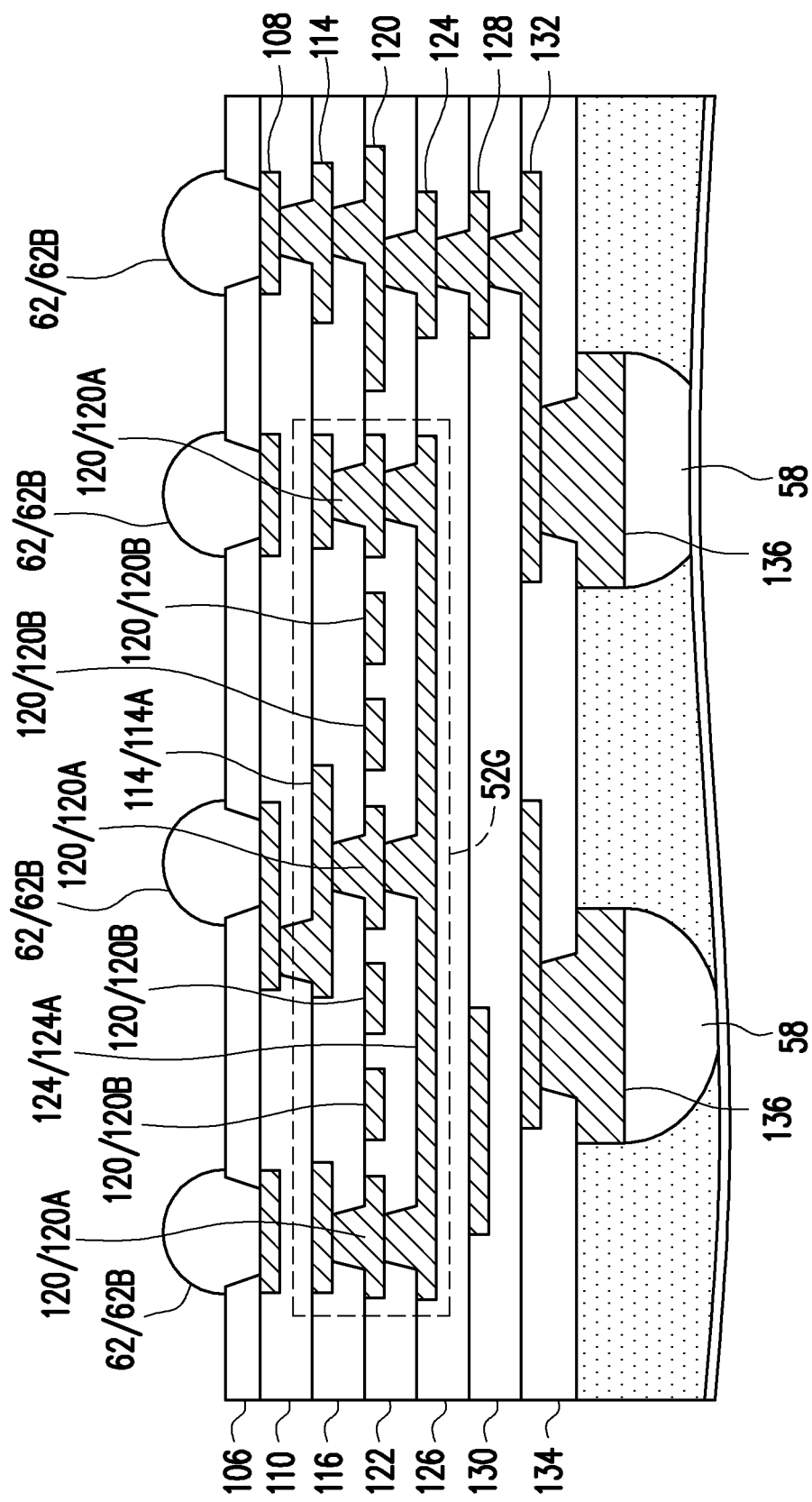
FIGS. 23 through 24B are various views of a package component, in accordance with some other embodiments.
Figure 24A:
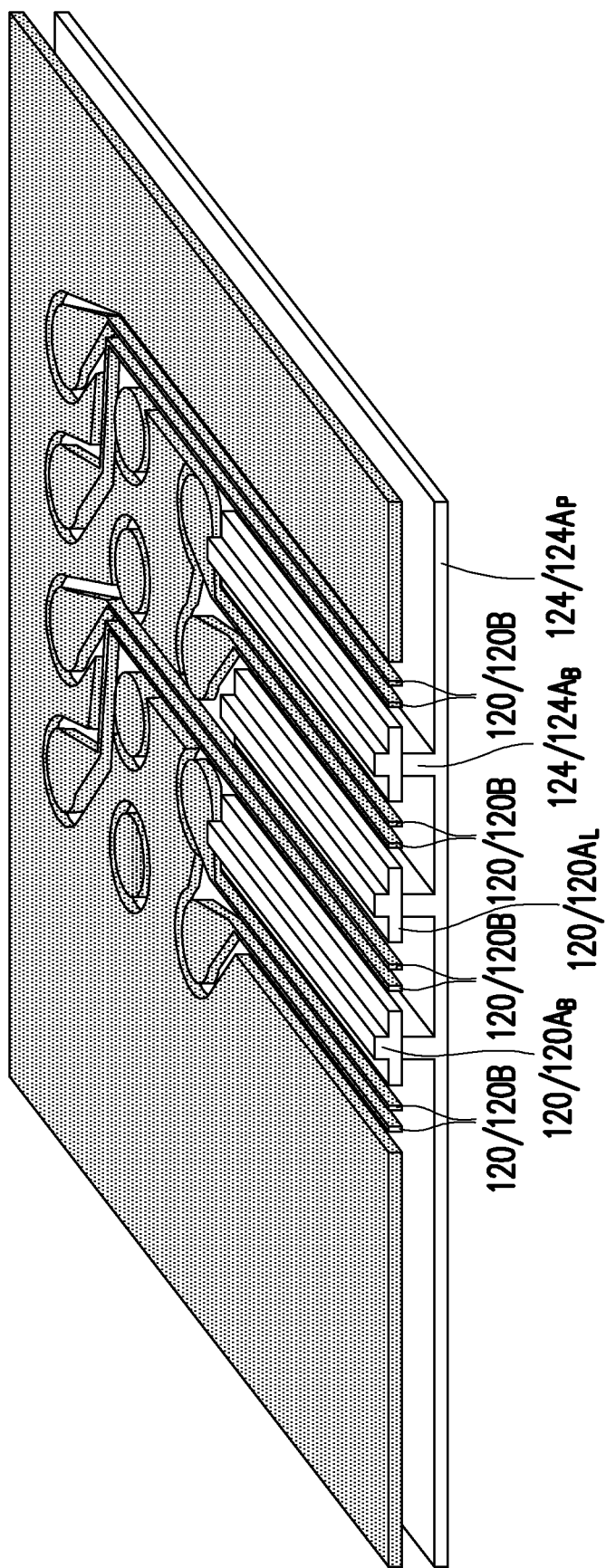
Figure 24B:
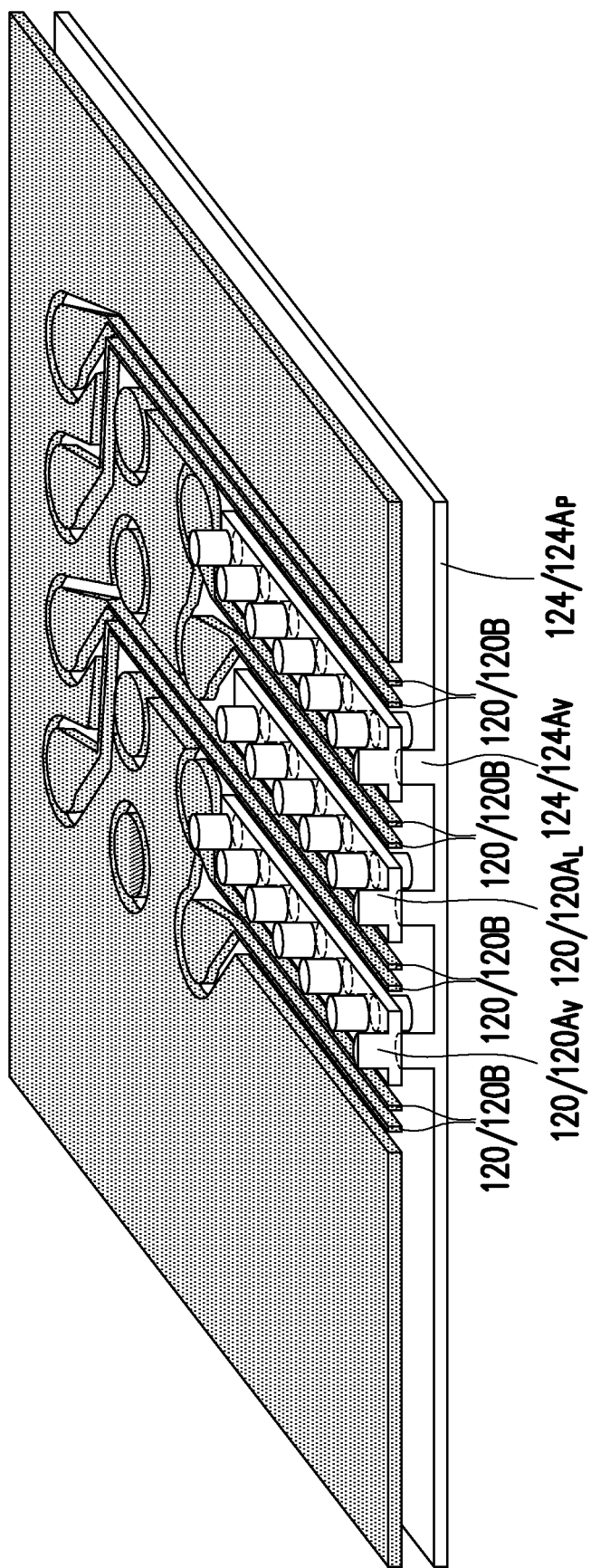

FIGS. 23 through 24B are various views of the redistribution structure 52, in accordance with some other embodiments. FIG. 23 is a cross-sectional view, and FIGS. 24A and 24B are three-dimensional views. Some features (e.g., dielectric layers) are omitted in FIGS. 24A and 24B for clarity of illustration. In these embodiments, the grounding structure 52G is formed among three intermediate layers of the redistribution structure 52. The metallization pattern 114 includes grounding features 114A. The metallization pattern 120 includes grounding features 120A and transmission lines 120B, with the transmission lines 120B being similar to the transmission lines 108B (see FIG. 15). Each ground feature 120A has a line portion $120A_L$, and either has bar portions $120A_B$ (see FIG. 24A) or via portions $120A_V$ (see FIG. 24B), which connect the line portions $120A_L$ to the grounding features 114A. The metallization pattern 124 includes grounding features 124A, with the grounding features 124A being similar to the grounding features 114A (see FIG. 15). Each ground feature 124A has a planar portion $124A_P$, and either has bar portions $124A_B$ (see FIG. 24A) or via portions $124A_V$ (see FIG. 24B), which connect the planar portion $124A_P$ to the line portions $120A_L$ of the ground features 120A.

Figure 25:
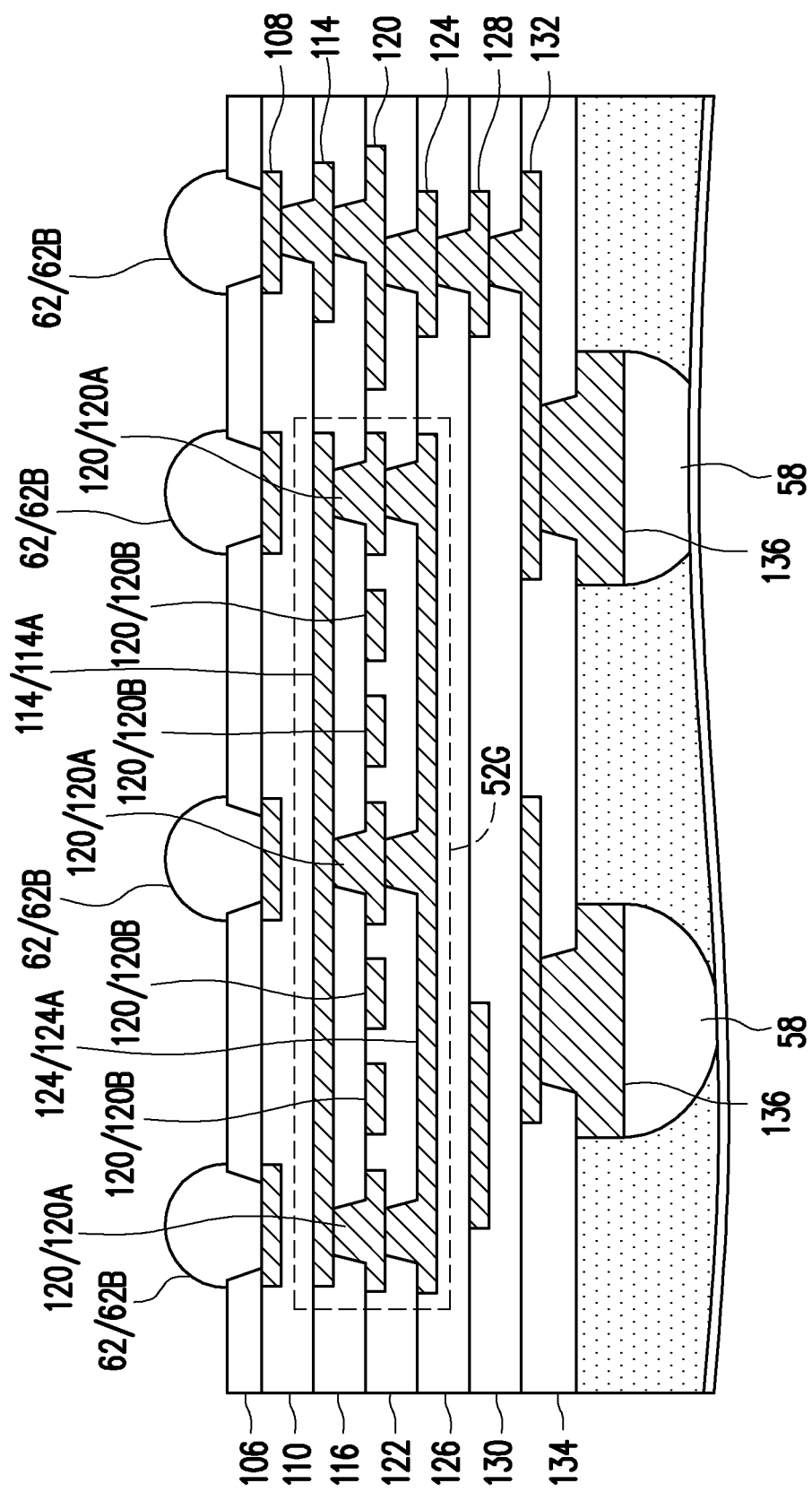
FIGS. 25 through 26B are various views of a package component, in accordance with some other embodiments.
Figure 26A:
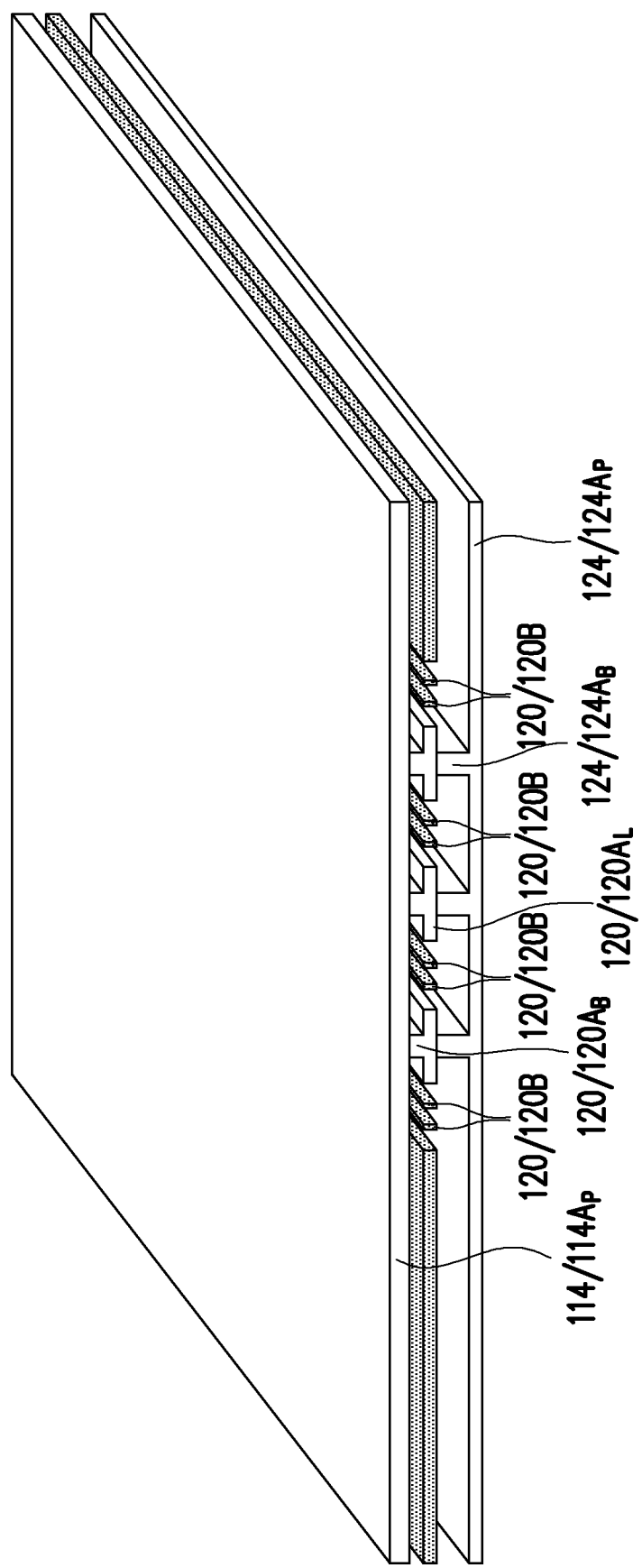
Figure 26B:
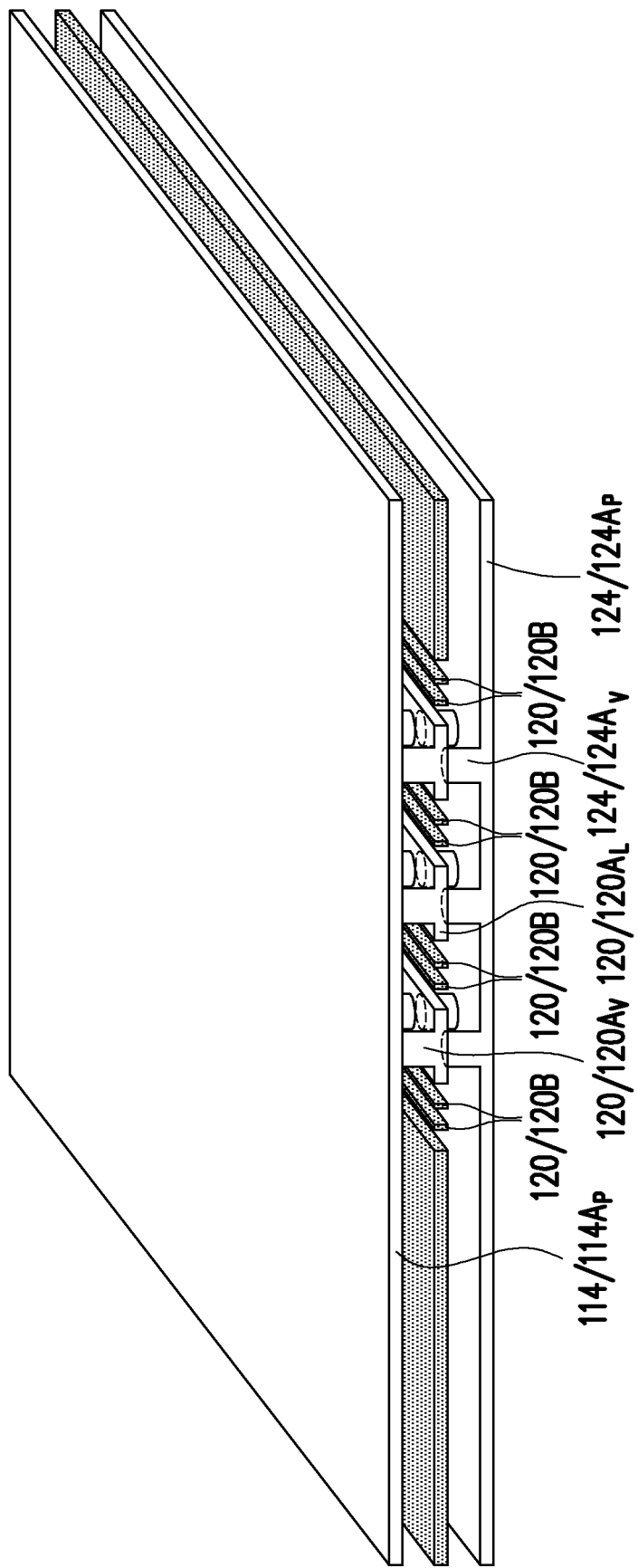

FIGS. 25 through 26B are various views of the redistribution structure 52, in accordance with some other embodiments. FIG. 25 is a cross-sectional view, and FIGS. 26A and 26B are three-dimensional views. Some features (e.g., dielectric layers) are omitted in FIGS. 26A and 26B for clarity of illustration. In these embodiments, the grounding structure 52G is formed among three intermediate layers of the redistribution structure 52. The metallization pattern 114 includes grounding features 114A. The metallization pattern 120 includes grounding features 120A and transmission lines 120B. Each ground feature 120A has a line portion $120A_L$, and either has bar portions $120A_B$ (see FIG. 26A) or via portions $120A_V$ (see FIG. 26B), which connect the line portions $120A_L$ to the grounding features 114A. The metallization pattern 124 includes grounding features 124A. Each ground feature 124A has a planar portion $124A_P$, and either has bar portions $124A_B$ (see FIG. 26A) or via portions $124A_V$ (see FIG. 26B), which connect the planar portion $124A_P$ to the line portions $120A_L$ of the ground features 120A.

FIGS. 27 through 30 are various views of intermediate steps during a process for forming the redistribution structure 52, in accordance with some other embodiments. A detailed view of a region of the redistribution structure 52 is shown. In this embodiment, some of the dielectric layers 110, 116, 122, 126, 130 of the redistribution structure 52 are formed of a photo-insensitive material, with the topmost and bottommost dielectric layers 106 and 134 being formed of a photo-sensitive material.

Figure 27:
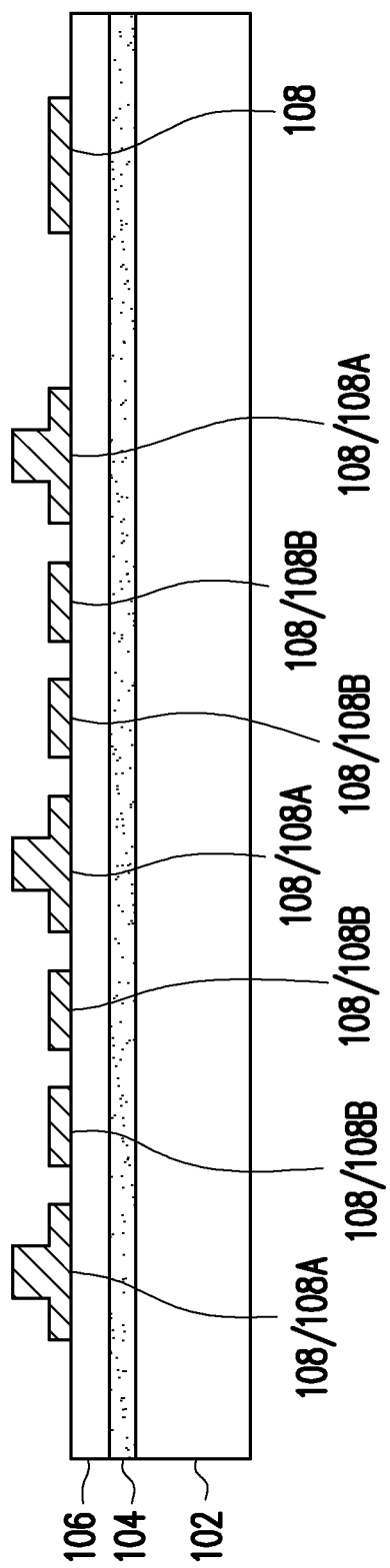
FIGS. 27 through 30 are various views of intermediate steps during a process for forming a package component, in accordance with some other embodiments.

In FIG. 27, the dielectric layer 106 is deposited over the carrier substrate 102, e.g., on the release layer 104. The dielectric layer 106 is formed of a photo-sensitive material. The metallization pattern 108 is then formed on the dielectric layer 106. In this embodiment, the metallization pattern 108 includes conductive lines on and extending laterally along the major surface of the dielectric layer 106, and includes conductive vias on the conductive lines.

As an example to form the metallization pattern 108, a seed layer is formed over the dielectric layer 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A first photoresist is then formed and patterned on the seed layer. The first photoresist may be formed by spin coating or the like and may be exposed to light for patterning. The pattern of the first photoresist corresponds to the conductive lines. The patterning forms openings through the first photoresist to expose the seed layer. A conductive material is then formed in the openings of the first photoresist and on the exposed portions of the seed layer. The conductive material may be formed by plating, such as electroplating or electroless plating, or the like. The conductive material may comprise a metal, like copper, titanium, tungsten, aluminum, or the like. The first photoresist is then removed, such as by an acceptable ashing or stripping process, such as using an oxygen plasma or the like. A second photoresist is then formed and patterned on the seed layer and conductive lines. The second photoresist may be formed by spin coating or the like and may be exposed to light for patterning. The pattern of the second photoresist corresponds to the conductive vias. The patterning forms openings through the second photoresist to expose the conductive lines. Additional conductive material is then formed in the openings of the second photoresist and on the exposed portions of the conductive lines. The additional conductive material may be formed by plating from the conductive lines, without forming a seed layer on the conductive lines. The combination of the conductive material and underlying portions of the seed layer form the metallization pattern 108. The second photoresist and portions of the seed layer on which the conductive material is not formed are removed. The second photoresist may be removed by an acceptable ashing or stripping process, such as using an oxygen plasma or the like. Once the second photoresist is removed, exposed portions of the seed layer are removed, such as by using an acceptable etching process, such as by wet or dry etching.

Figure 28:
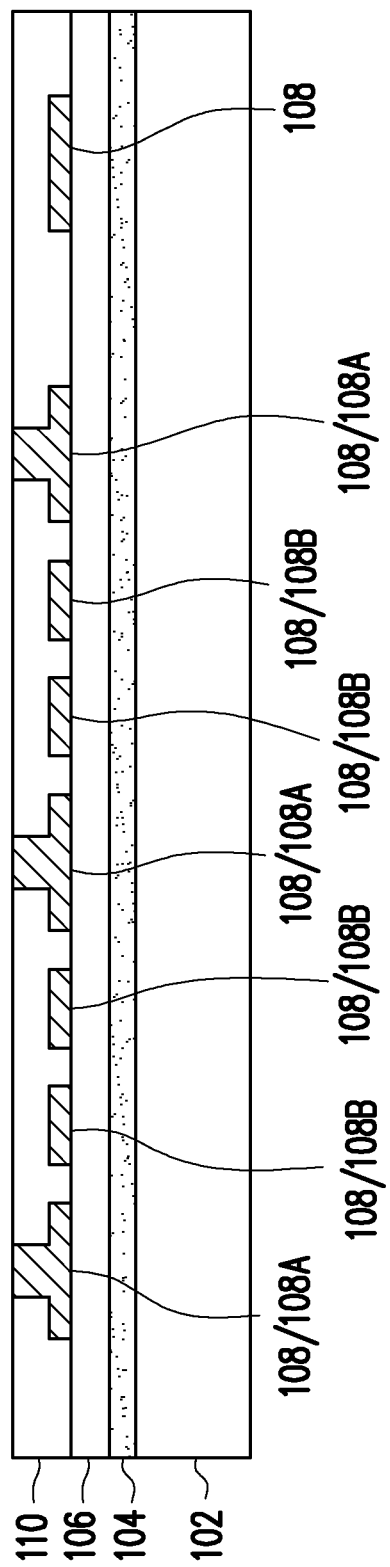

In FIG. 28, the dielectric layer 110 is formed around the metallization pattern 108 and on the dielectric layer 106. After formation, the dielectric layer 110 surrounds the metallization pattern 108. In some embodiments, the dielectric layer 110 is formed of a photo-insensitive material, such as a molding compound, epoxy, or the like. The photo-insensitive material may be applied by compression molding, transfer molding, or the like, and may be applied in liquid or semi-liquid form and then subsequently cured. The dielectric layer 110 is formed over the metallization pattern 108 such that the metallization pattern 108 is buried or covered. A planarization process is then performed on the dielectric layer 110 to expose the conductive vias of the metallization pattern 108. Topmost surfaces of the dielectric layer 110 and metallization pattern 108 are planar after the planarization process. The planarization process may be, for example, a chemical-mechanical polish (CMP).

Figure 29:
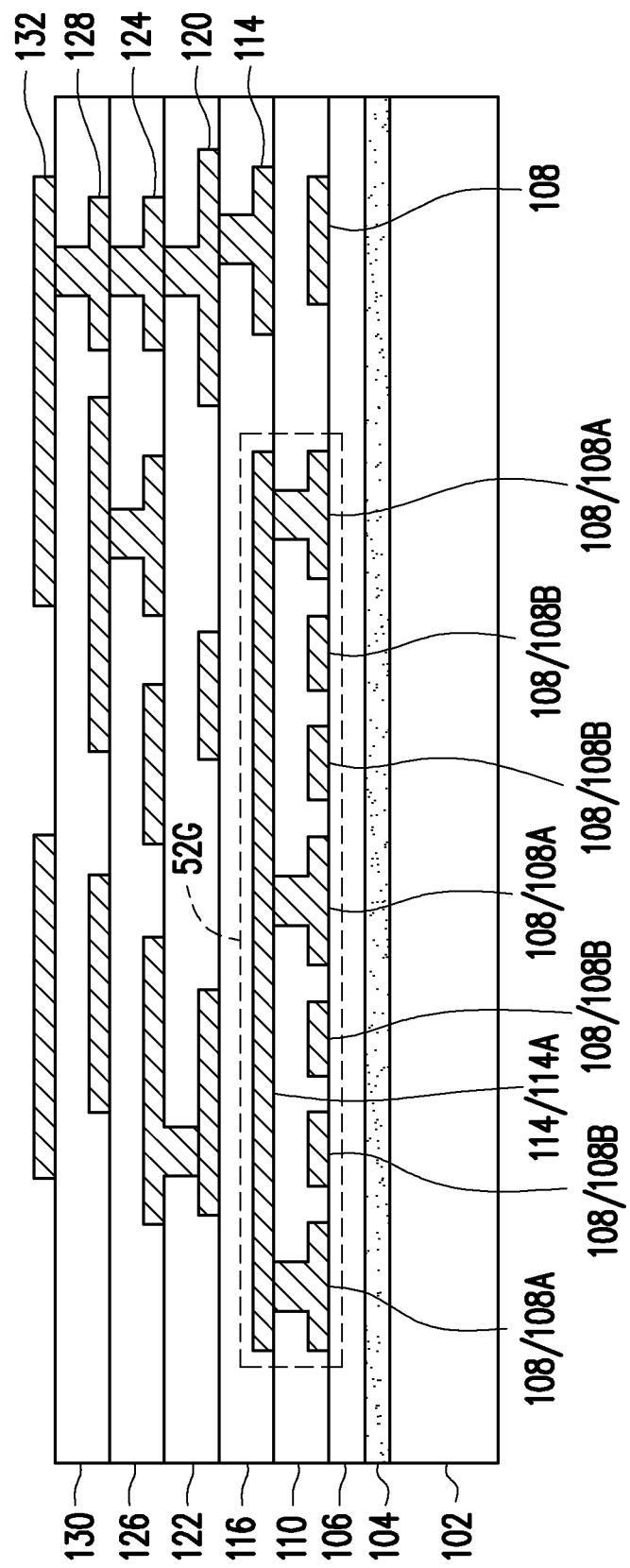

In FIG. 29, some of the steps and process discussed above are repeated to form the dielectric layers 116, 122, 126, 130; and to form the metallization patterns 114, 120, 124, 128, 132. The dielectric layers 116, 122, 126, 130 may be formed in a similar manner and of a similar material as the dielectric layer 110. In some embodiments, the dielectric layers 116, 122, 126, 130 are each a photo-insensitive material. The metallization patterns 114, 120, 124, 128, 132 may be formed in a similar manner and of a similar material as the metallization pattern 108.

Figure 30:
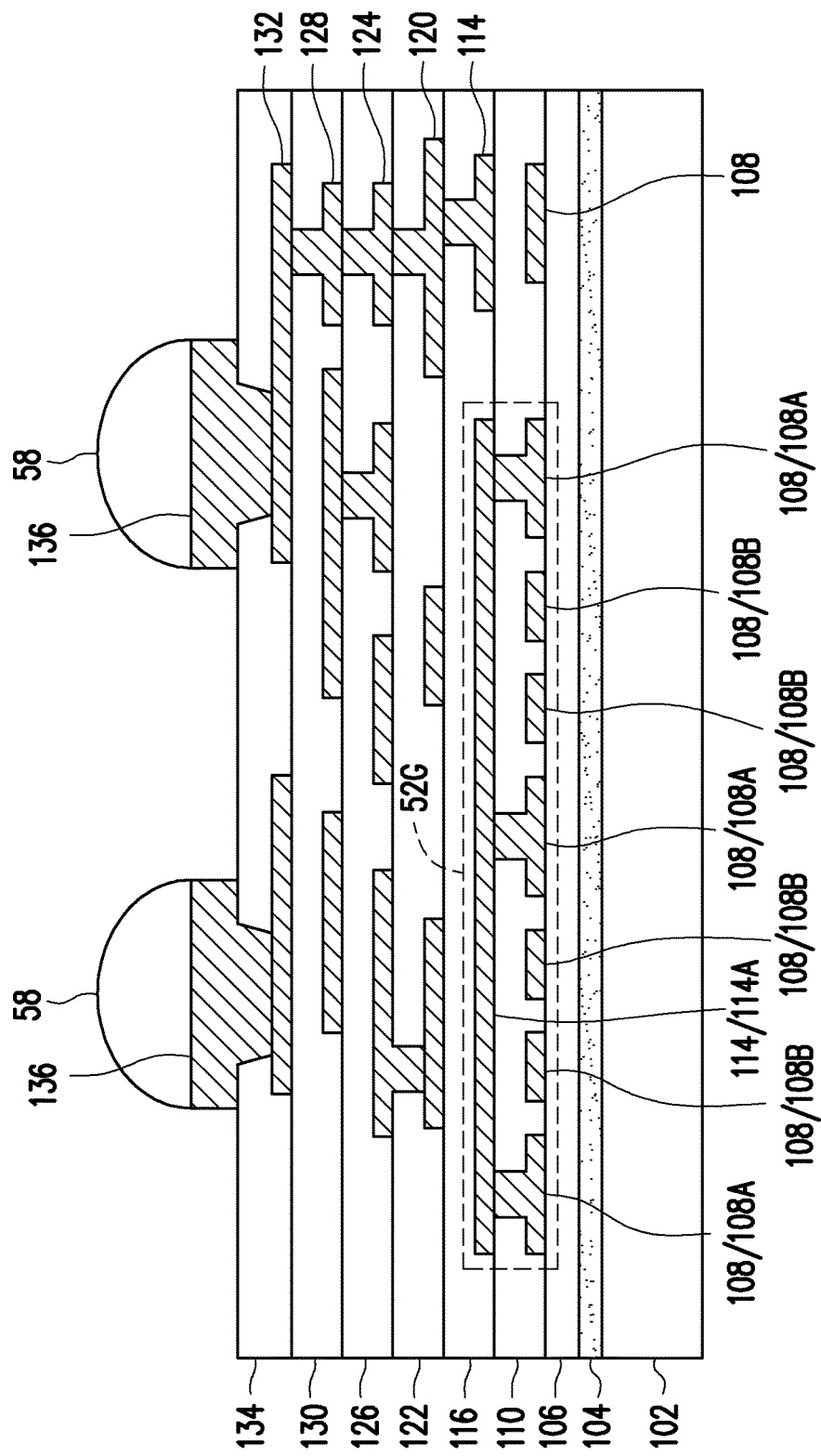

In FIG. 30, the dielectric layer 134 is deposited over the dielectric layer 130 and metallization pattern 132. The dielectric layer 134 is formed of a photo-sensitive material. The UBMs 136 are then formed for external connection to the redistribution structure 52. Finally, the conductive connectors 58 are formed on the UBMs 136.

Figure 31:
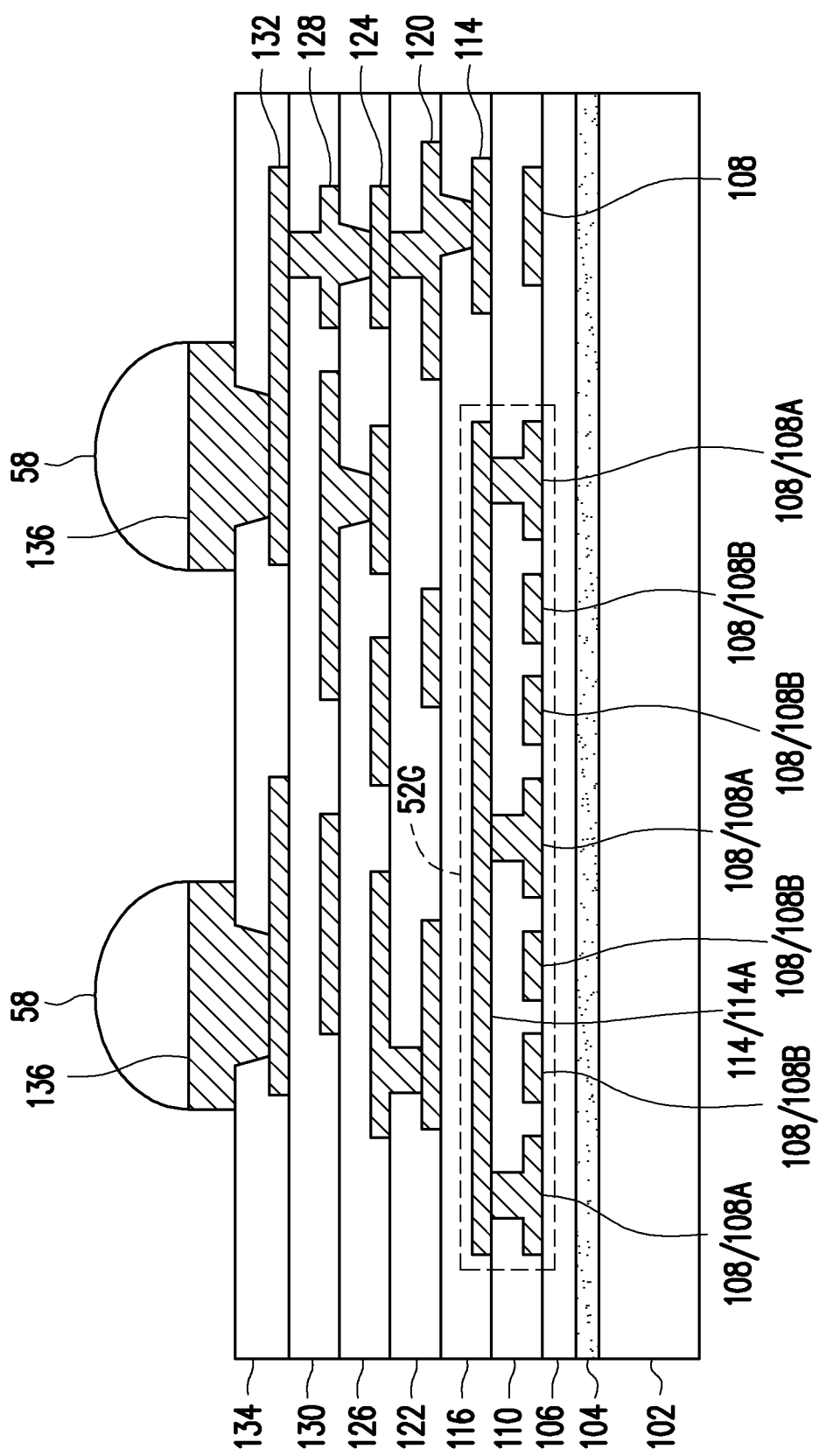
FIG. 31 is a view of a package component, in accordance with some other embodiments.

In some embodiments, features from the embodiment of FIGS. 3 through 9 and the embodiment of FIGS. 27 through 31 may be combined. An example of such a structure is shown in FIG. 31, where alternating ones of the dielectric layers 106, 116, 126, 134 are formed of a photo-sensitive material, and alternating ones of the dielectric layers 110, 122, and 130 are formed of a photo-insensitive material. Some of the metallization patterns 120, 128 can include two sets of conductive vias (e.g., one set extending towards the carrier substrate 102, and one set extending away from the carrier substrate 102), with each set of conductive vias being formed in a different plating process, using the same seed layer for both plating processes.

Embodiments may achieve advantages. Forming the conductive features of the grounding structure 52G by photolithography and plating techniques allows the conductive features of the grounding structure 52G to be formed to a small sizes and with small separation distances. More features may thus be formed in each layer of the redistribution structure 52, while still allowing for sufficient isolation of the transmission lines. For example, the grounding structure 52G may be formed in as few as two layers. Manufacturing costs of the redistribution structure 52 may thus be reduced.

In an embodiment, a device includes: a semiconductor device; and a redistribution structure including: a first dielectric layer; a first grounding feature on the first dielectric layer; a second grounding feature on the first dielectric layer; a first pair of transmission lines on the first dielectric layer, the first pair of transmission lines being laterally disposed between the first grounding feature and the second grounding feature, the first pair of transmission lines being electrically coupled to the semiconductor device; a second dielectric layer on the first grounding feature, the second grounding feature, and the first pair of transmission lines; and a third grounding feature extending laterally along and through the second dielectric layer, the third grounding feature being physically and electrically coupled to the first grounding feature and the second grounding feature, where the first pair of transmission lines extend continuously along a length of the third grounding feature.

In some embodiments of the device, the first pair of transmission lines are separated from the first grounding feature and from the second grounding feature by a first distance, the first pair of transmission lines are separated from one another by a second distance, and the second distance is greater than the first distance. In some embodiments of the device, the second distance is greater than twice the first distance. In some embodiments of the device, the first grounding feature and the second grounding feature each have a first width, the first pair of transmission lines each have a second width, and the first width is greater than the second width. In some embodiments of the device, the first width is less than twice the second width. In some embodiments of the device, the redistribution structure further includes: a fourth grounding feature on the first dielectric layer, the third grounding feature being physically and electrically coupled to the fourth grounding feature; and a second pair of transmission lines on the first dielectric layer, the second pair of transmission lines being laterally disposed between the second grounding feature and the fourth grounding feature, the second pair of transmission lines being electrically coupled to the semiconductor device. In some embodiments of the device, the third grounding feature laterally extends between the first grounding feature and the fourth grounding feature. In some embodiments of the device, the first grounding feature and the second grounding feature each have portions extending laterally along and through the first dielectric layer. In some embodiments, the device further includes: an interposer attached to the redistribution structure; and external connectors attached to the interposer, the redistribution structure and the interposer collectively coupling the semiconductor device to the external connectors. In some embodiments of the device, the third grounding feature includes a conductive bar extending through the second dielectric layer. In some embodiments of the device, the third grounding feature includes conductive vias extending through the second dielectric layer.

In an embodiment, a device includes: a first dielectric layer; a first grounding feature on the first dielectric layer; a second grounding feature on the first dielectric layer; a third grounding feature on the first dielectric layer; a first pair of transmission lines on the first dielectric layer, the first pair of transmission lines being laterally disposed between the first grounding feature and the second grounding feature; a second pair of transmission lines on the first dielectric layer, second first pair of transmission lines being laterally disposed between the second grounding feature and the third grounding feature; a second dielectric layer on the first grounding feature, the second grounding feature, the third grounding feature, the first pair of transmission lines, and the second pair of transmission lines; and a fourth grounding feature on the second dielectric layer, the fourth grounding feature being physically and electrically coupled to the first grounding feature, the second grounding feature, and the third grounding feature.

In some embodiments of the device, the second dielectric layer is a photo-sensitive material. In some embodiments of the device, the second dielectric layer is a photo-insensitive material. In some embodiments, the device further includes: an integrated circuit die; and external connectors, the first pair of transmission lines and the second pair of transmission lines electrically coupling the integrated circuit die to the external connectors.

In an embodiment, a method includes: depositing a first dielectric layer; plating a first metallization pattern on the first dielectric layer, the first metallization pattern including a first pair of transmission lines, a second pair of transmission lines, and a first grounding feature, the first grounding feature being laterally disposed between the first pair of transmission lines and the second pair of transmission lines, the first grounding feature having a first length, the first pair of transmission lines and the second pair of transmission lines extend continuously along the first length of the first grounding feature; depositing a second dielectric layer on the first metallization pattern and the first dielectric layer; patterning a first opening in the second dielectric layer, the first opening exposing the first grounding feature, the first pair of transmission lines and the second pair of transmission lines remaining covered by the second dielectric layer after the patterning; and plating a second metallization pattern having a second grounding feature on the second dielectric layer and a third grounding feature in the first opening.

In some embodiments of the method, the second dielectric layer is a photo-sensitive material, and patterning the first opening in the second dielectric layer includes exposing the photo-sensitive material to light and curing the photo-sensitive material. In some embodiments, the method further includes: patterning a second opening in the first dielectric layer, the first grounding feature having a first portion on the first dielectric layer and a second portion in the second opening. In some embodiments, the method further includes: depositing a third dielectric layer on the second metallization pattern and the second dielectric layer; forming under-bump metallurgies through the third dielectric layer; forming first conductive connectors on the under-bump metallurgies; and attaching an interposer to the under-bump metallurgies with the first conductive connectors. In some embodiments, the method further includes: patterning a second opening in the first dielectric layer, the second opening exposing the first grounding feature; and forming a third conductive connector in the second opening; and attaching a semiconductor device to the first grounding feature with the third conductive connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor device; and
a redistribution structure comprising:
    a first dielectric layer;
    a first grounding feature on the first dielectric layer;
    a second grounding feature on the first dielectric layer;
    a first pair of transmission lines on the first dielectric layer, the first pair of transmission lines being laterally disposed between the first grounding feature and the second grounding feature, the first pair of transmission lines being electrically coupled to the semiconductor device;
    a second dielectric layer on the first grounding feature, the second grounding feature, and the first pair of transmission lines; and
    a third grounding feature extending laterally along and through the second dielectric layer, the third grounding feature being physically and electrically coupled to the first grounding feature and the second grounding feature,
    wherein the first pair of transmission lines extend continuously along a length of the third grounding feature.

2. The device of claim 1, wherein the first grounding feature and the second grounding feature each have portions extending laterally along and through the first dielectric layer.

3. The device of claim 1 further comprising:
an interposer attached to the redistribution structure; and
external connectors attached to the interposer, the redistribution structure and the interposer collectively coupling the semiconductor device to the external connectors.

4. The device of claim 1, wherein the third grounding feature comprises a conductive bar extending through the second dielectric layer.

5. The device of claim 1, wherein the third grounding feature comprises conductive vias extending through the second dielectric layer.

6. The device of claim 1, wherein the first pair of transmission lines are separated from the first grounding feature and from the second grounding feature by a first distance, wherein the first pair of transmission lines are separated from one another by a second distance, and wherein the second distance is greater than the first distance.

7. The device of claim 6, wherein the second distance is greater than twice the first distance.

8. The device of claim 1, wherein the first grounding feature and the second grounding feature each have a first width, wherein the first pair of transmission lines each have a second width, and wherein the first width is greater than the second width.

9. The device of claim 8, wherein the first width is less than twice the second width.

10. The device of claim 1, wherein the redistribution structure further comprises:
a fourth grounding feature on the first dielectric layer, the third grounding feature being physically and electrically coupled to the fourth grounding feature; and
a second pair of transmission lines on the first dielectric layer, the second pair of transmission lines being laterally disposed between the second grounding feature and the fourth grounding feature, the second pair of transmission lines being electrically coupled to the semiconductor device.

11. The device of claim 10, wherein the third grounding feature laterally extends between the first grounding feature and the fourth grounding feature.

12. A device comprising:
a first dielectric layer;
a first grounding feature on the first dielectric layer;
a second grounding feature on the first dielectric layer;
a third grounding feature on the first dielectric layer;
a first pair of transmission lines on the first dielectric layer, the first pair of transmission lines being laterally disposed between the first grounding feature and the second grounding feature;
a second pair of transmission lines on the first dielectric layer, second first pair of transmission lines being laterally disposed between the second grounding feature and the third grounding feature;
a second dielectric layer on the first grounding feature, the second grounding feature, the third grounding feature, the first pair of transmission lines, and the second pair of transmission lines; and
a fourth grounding feature on the second dielectric layer, the fourth grounding feature being physically and electrically coupled to the first grounding feature, the second grounding feature, and the third grounding feature.

13. The device of claim 12, wherein the second dielectric layer is a photo-sensitive material.

14. The device of claim 12, wherein the second dielectric layer is a photo-insensitive material.

15. The device of claim 12 further comprising:
an integrated circuit die; and
external connectors, the first pair of transmission lines and the second pair of transmission lines electrically coupling the integrated circuit die to the external connectors.

16. A method comprising:
depositing a first dielectric layer;
plating a first metallization pattern on the first dielectric layer, the first metallization pattern comprising a first pair of transmission lines, a second pair of transmission lines, and a first grounding feature, the first grounding feature being laterally disposed between the first pair of transmission lines and the second pair of transmission lines, the first grounding feature having a first length, the first pair of transmission lines and the second pair of transmission lines extend continuously along the first length of the first grounding feature;
depositing a second dielectric layer on the first metallization pattern and the first dielectric layer;
patterning a first opening in the second dielectric layer, the first opening exposing the first grounding feature, the first pair of transmission lines and the second pair of transmission lines remaining covered by the second dielectric layer after the patterning; and
plating a second metallization pattern having a second grounding feature on the second dielectric layer and a third grounding feature in the first opening.

17. The method of claim 16, wherein the second dielectric layer is a photo-sensitive material, and wherein patterning the first opening in the second dielectric layer comprises exposing the photo-sensitive material to light and curing the photo-sensitive material.

18. The method of claim 16 further comprising:
patterning a second opening in the first dielectric layer, the first grounding feature having a first portion on the first dielectric layer and a second portion in the second opening.

19. The method of claim 16 further comprising:
depositing a third dielectric layer on the second metallization pattern and the second dielectric layer;
forming under-bump metallurgies through the third dielectric layer;
forming first conductive connectors on the under-bump metallurgies; and
attaching an interposer to the under-bump metallurgies with the first conductive connectors.

20. The method of claim 19 further comprising:
patterning a second opening in the first dielectric layer, the second opening exposing the first grounding feature; and
forming a third conductive connector in the second opening; and
attaching a semiconductor device to the first grounding feature with the third conductive connector.

* * * * *